United States Patent
Yang et al.

(10) Patent No.: US 12,424,165 B2
(45) Date of Patent: Sep. 23, 2025

(54) PIXEL DRIVING CIRCUIT AND DRIVING METHOD THEREFOR, DISPLAY PANEL, AND DISPLAY DEVICE

(71) Applicants: Chengdu BOE Optoelectronics Technology Co., Ltd., Sichuan (CN); BOE Technology Group Co. Ltd., Beijing (CN)

(72) Inventors: Zhongliu Yang, Beijing (CN); Meng Li, Beijing (CN); Tianyi Cheng, Beijing (CN); Haigang Qing, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/563,498

(22) PCT Filed: Nov. 1, 2022

(86) PCT No.: PCT/CN2022/128926
§ 371 (c)(1),
(2) Date: Nov. 22, 2023

(87) PCT Pub. No.: WO2024/092496
PCT Pub. Date: May 10, 2024

(65) Prior Publication Data
US 2025/0078750 A1    Mar. 6, 2025

(51) Int. Cl.
G09G 3/3233    (2016.01)
H10K 59/121   (2023.01)
H10K 59/131   (2023.01)

(52) U.S. Cl.
CPC ... *G09G 3/3233* (2013.01); *G09G 2300/0426* (2013.01); *G09G 2300/0819* (2013.01);
(Continued)

(58) Field of Classification Search
CPC ......... G09G 3/3233; G09G 2300/0426; G09G 2300/0819; G09G 2300/0842;
(Continued)

(56) References Cited

U.S. PATENT DOCUMENTS 11,211,010 B2  12/2021  Yuan
11,393,399 B2   7/2022  Na
(Continued)

FOREIGN PATENT DOCUMENTS

CN    107358918 A    11/2017
CN    107452339 A    12/2017
(Continued)

OTHER PUBLICATIONS

Written Opinion from PCT/CN2022/128926 dated Apr. 1, 2023.
International Search Report from PCT/CN2022/128926 dated Apr. 1, 2023.

*Primary Examiner* — Abdul-Samad A Adediran
(74) *Attorney, Agent, or Firm* — Calfee, Halter & Griswold LLP

(57) ABSTRACT

A pixel driving circuit, including: a driving circuit, connected to a first node, a second node and a third node, and configured to input a driving current to the third node through the second node according to a signal of the first node; a compensation circuit, connected to the first node, the third node and a first gate driving signal end, and configured to turn on the first node and the third node in response to a signal of the first gate driving signal end; a first light-emitting control circuit, connected to the third node, a fourth node and a first enabling signal end, and configured to
(Continued)

communicate with the third node and the fourth node in response to a signal of the first enabling signal end; a first reset circuit, connected to the fourth node, a first initial signal end and a first reset signal end, and configured to transmit a signal of the first initial signal end to the fourth node in response to a signal of the first reset signal end; and a second reset circuit, connected to the second node, a second initial signal end and a second reset signal end, and configured to transmit a signal of the second initial signal end to the second node in response to a signal of the second reset signal end.

17 Claims, 20 Drawing Sheets

(52) U.S. Cl.
CPC .............. *G09G 2300/0842* (2013.01); *G09G 2300/0861* (2013.01); *G09G 2310/08* (2013.01); *H10K 59/1213* (2023.02); *H10K 59/131* (2023.02)

(58) Field of Classification Search
CPC ....... G09G 2300/0861; G09G 2310/08; H10K 59/131; H10K 59/1213
See application file for complete search history.

(56) References Cited

U.S. PATENT DOCUMENTS

| | | | |
|---|---|---|---|
| 11,455,951 | B2 | 9/2022 | Yang |
| 2013/0002616 | A1 | 1/2013 | Kim |
| 2021/0104196 | A1 | 4/2021 | Yuan |
| 2021/0327352 | A1 | 10/2021 | Zhang |
| 2021/0366397 | A1 | 11/2021 | Na |
| 2021/0367122 | A1 | 11/2021 | Park |
| 2021/0383752 | A1 | 12/2021 | Yang |
| 2022/0102470 | A1 | 3/2022 | Seo |
| 2022/0148506 | A1 | 5/2022 | Yuan |
| 2022/0180810 | A1 | 6/2022 | Zhang |
| 2022/0181425 | A1 | 6/2022 | Sakai |
| 2022/0208075 | A1 | 6/2022 | Kim |
| 2022/0343853 | A1* | 10/2022 | Gao .................. H10K 59/1213 |
| 2022/0366851 | A1 | 11/2022 | Yang |
| 2024/0005858 | A1* | 1/2024 | Zhang ................ G09G 3/3233 |

FOREIGN PATENT DOCUMENTS

| | | |
|---|---|---|
| CN | 107610651 A | 1/2018 |
| CN | 109285500 A | 1/2019 |
| CN | 107610651 B | 11/2019 |
| CN | 109285500 B | 11/2020 |
| CN | 112102785 A | 12/2020 |
| CN | 112634832 A | 4/2021 |
| CN | 113724608 A | 11/2021 |
| CN | 114222615 A | 3/2022 |
| CN | 114388558 A | 4/2022 |
| CN | 114424280 A | 4/2022 |
| CN | 114405935 A | 5/2022 |
| CN | 114495835 A | 5/2022 |
| CN | 114514573 A | 5/2022 |
| CN | 115083344 A | 9/2022 |
| KR | 20210143983 A | 11/2021 |

* cited by examiner

PIXEL DRIVING CIRCUIT AND DRIVING METHOD THEREFOR, DISPLAY PANEL, AND DISPLAY DEVICE

CROSS REFERENCE

The present disclosure is based upon International Application No. PCT/CN2022/128926, filed on Nov. 1, 2022, the entire contents of which are incorporated herein by reference.

TECHNICAL FIELD

The present disclosure relates to the field of display technology, and in particular to a pixel driving circuit and a driving method therefor, a display panel, and a display device.

BACKGROUND

In related art, a display panel includes a pixel driving circuit, and the driving transistor in the pixel driving circuit tend to affect the display effect of the display panel due to the hysteresis effect.

It should be noted that the information disclosed in the above background part is only for enhancing the understanding of the background of the present disclosure, and therefore may include information that does not constitute the related art known to those of ordinary skill in the art.

SUMMARY

According to an aspect of the present disclosure, there is provided a pixel driving circuit, where pixel driving circuit includes: a driving circuit, a compensation circuit, a first light-emitting control circuit, a first reset circuit and a second reset circuit. The driving circuit is connected to a first node, a second node and a third node, and configured to input a driving current to the third node through the second node according to a signal of the first node; the compensation circuit is connected to the first node, the third node and a first gate driving signal end, and configured to turn on the first node and the third node in response to a signal of the first gate driving signal end; the first light-emitting control circuit is connected to the third node, a fourth node and a first enabling signal end, and configured to communicate with the third node and the fourth node in response to a signal of the first enabling signal end; the first reset circuit is connected to the fourth node, a first initial signal end and a first reset signal end, and configured to transmit a signal of the first initial signal end to the fourth node in response to a signal of the first reset signal end; and the second reset circuit is connected to the second node, a second initial signal end and a second reset signal end, and configured to transmit a signal of the second initial signal end to the second node in response to a signal of the second reset signal end.

In some embodiments of the present disclosure, the pixel driving circuit further includes: a data writing circuit, a second light-emitting control circuit, and a storage circuit. The data writing circuit is connected to the second node, a data signal end and a second gate driving signal end, and configured to transmit a signal of the data signal end to the second node in response to a signal of the second gate driving signal end; the second light-emitting control circuit is connected to a first power supply end, the second node and a second enabling signal end, and configured to transmit a signal of the first power supply end to the second node in response to a signal of the second enabling signal end; and, the storage circuit is connected between the first node and the first power supply end.

In some embodiments of the present disclosure, the driving circuit includes a driving transistor, a first pole of the driving transistor being connected to the second node, a second pole of the driving transistor being connected to the third node, and a gate of the driving transistor being connected to the first node; the compensation circuit includes a second transistor, a first pole of the second transistor being connected to the first node, a second pole of the second transistor being connected to the third node, and a gate of the second transistor being connected to the first gate driving signal end; the first light-emitting control circuit includes a sixth transistor, a first pole of the sixth transistor being connected to the third node, a second pole of the sixth transistor being connected to the fourth node, and a gate of the sixth transistor being connected to the first enabling signal end; the first reset circuit includes a first transistor, a first pole of the first transistor the being connected to the first initial signal end, a second pole of the first transistor being connected to the fourth node, and a gate of the first transistor being connected to the first reset signal end; and the second reset circuit includes a seventh transistor, a first pole of the seventh transistor being connected to the second initial signal end, a second pole of the seventh transistor being connected to the second node, and a gate of the seventh transistor being connected to the second reset signal end.

In some embodiments of the present disclosure, the second transistor is an N-type transistor, and the driving transistor is a P-type transistor.

In some embodiments of the present disclosure, the data writing circuit includes a fourth transistor, a first pole of the fourth transistor being connected to the data signal end, a second pole of the fourth transistor being connected to the second node, and a gate of the fourth transistor being connected to the second gate driving signal end; the second light-emitting control circuit includes a fifth transistor, a first pole of the fifth transistor being connected to the first power supply end, a second pole of the fifth transistor being connected to the second node, and a gate of the fifth transistor being connected to the second enabling signal end; and the storage circuit includes a capacitor, a first electrode of the capacitor being connected to the first node, and a second electrode of the capacitor being connected to the first power supply end.

In some embodiments of the present disclosure, the driving method is used for driving the above-mentioned pixel driving circuit, and the driving method includes:
  in a first reset phase, inputting an active level to the first reset signal end and the second reset signal end; and
  in a hysteresis elimination phase, inputting an active level to the first reset signal end, the first enabling signal end and the first gate driving signal end.

According to an aspect of the present disclosure, there is provided a display panel, where the display panel includes the above-mentioned pixel driving circuit.

According to an aspect of the present disclosure, there is provided a display panel, where the display panel includes a pixel driving circuit and a light-emitting unit; the pixel driving circuit is configured to provide a driving current to the light-emitting unit; the pixel driving circuit includes a driving transistor, a second transistor, a sixth transistor, a first transistor, and a seventh transistor; a first pole of the second transistor is connected to a gate of the driving transistor, and a second pole of the second transistor is connected to a second pole of the driving transistor; a first pole of the sixth transistor is connected to the second pole of the driving transistor, and a second pole of the sixth transistor is connected to a first electrode of the light-emitting unit; a first pole of the first transistor is connected to a first initial signal line, and a second pole of the first transistor is connected to the first electrode of the light-emitting unit; a first pole of the seventh transistor is connected to a second initial signal line, and a second pole of the seventh transistor is connected to a first pole of the driving transistor.

In some embodiments of the present disclosure, the display panel further includes: a base substrate, a first active layer, a first conductive layer, a second active layer, and a third conductive layer. The first active layer is located on a side of the base substrate; the first active layer includes a first active portion, a third active portion, a sixth active portion and a seventh active portion; the first active portion is configured to form a channel region of the first transistor, the third active portion is configured to form a channel region of the driving transistor, the sixth active portion is configured to form a channel region of the sixth transistor, and the seventh active portion is configured to form a channel region of the seventh transistor. The first conductive layer is located on a side of the first active layer away from the base substrate; the first conductive layer includes a first reset signal line, a second reset signal line, a first enabling signal line and a first conductive portion; orthographic projections of the first reset signal line, the second reset signal line and the first enabling signal line on the base substrate extend along a first direction; partial structure of the first reset signal line is configured to form a gate of the first transistor, partial structure of the second reset signal line is configured to form a gate of the seventh transistor, partial structure of the first enabling signal line is configured to form a gate of the sixth transistor, and the first conductive portion is configured to form the gate of the driving transistor. The second active layer is located on a side of the first conductive layer away from the base substrate, the second active layer includes a second active portion, and the second active portion is configured to form a channel region of the second transistor. The third conductive layer is located on a side of the second active layer away from the base substrate, the third conductive layer includes a first gate line, an orthographic projection of the first gate line on the base substrate extends along the first direction, and partial structure of the first gate line is configured to form a top gate of the second transistor.

In some embodiments of the present disclosure, an orthographic projection of the first reset signal line on the base substrate is located on a side of an orthographic projection of the second reset signal line on the base substrate away from an orthographic projection of the first conductive portion on the base substrate.

In some embodiments of the present disclosure, the pixel driving circuit further includes a fourth transistor, a first pole of the fourth transistor is connected to a data line, and a second pole of the fourth transistor is connected to the first pole of the driving transistor; the first active layer further includes a fourth active portion configured to form a channel region of the fourth transistor; the first conductive layer further includes a second gate line, an orthographic projection of the second gate line on the base substrate extends along the first direction and covers an orthographic projection of the fourth active portion on the base substrate, and partial structure of the second gate line is configured to form a gate of the fourth transistor; where, the orthographic projection of the second gate line on the base substrate is located between the orthographic projection of the first reset signal line on the base substrate and the orthographic projection of the second reset signal line on the base substrate.

In some embodiments of the present disclosure, in the first direction, an orthographic projection of the seventh active portion on the base substrate is located between an orthographic projection of the first active portion on the base substrate and an orthographic projection of the fourth active portion on the base substrate.

In some embodiments of the present disclosure, the first active portion and the sixth active portion are connected through partial structure of the first active layer; an orthographic projection of the first enabling signal line on the base substrate is located on a side of an orthographic projection of the first reset signal line on the base substrate away from an orthographic projection of the first conductive portion on the base substrate.

In some embodiments of the present disclosure, the pixel driving circuit further includes a fifth transistor, a first pole of the fifth transistor is connected to a power supply line, and a second pole of the fifth transistor is connected to the first pole of the driving transistor; the first active layer further includes a fifth active portion configured to form a channel region of the fifth transistor, and the fifth active portion is connected to the third active portion and the seventh active portion through partial structure of the first active layer; the first conductive layer further includes a second enabling signal line, an orthographic projection of the second enabling signal line on the base substrate extends along the first direction and covers an orthographic projection of the fifth active portion on the base substrate, and partial structure of the second enabling signal line is configured to form a gate of the fifth transistor; where, the orthographic projection of the second enabling signal line on the base substrate is located on a side of an orthographic projection of the first conductive portion on the base substrate away from an orthographic projection of the second reset signal line on the base substrate.

In some embodiments of the present disclosure, an orthographic projection of the first gate line on the base substrate is located between the orthographic projection of the first conductive portion on the base substrate and the orthographic projection of the second enabling signal lines on the base substrate.

In some embodiments of the present disclosure, in the first direction, an orthographic projection of the third active portion on the base substrate is located between an orthographic projection of the second active portion on the base substrate and an orthographic projection of the seventh active portion on the base substrate.

In some embodiments of the present disclosure, the display panel includes more than one repeating unit, the more than one repeating unit is distributed in an array in the first direction and a second direction, and the first direction intersects with the second direction; a repeating unit includes two pixel driving circuits distributed in the first direction, and the two pixel driving circuits in a same repeating unit are provided mirror-symmetrically.

In some embodiments of the present disclosure, the pixel driving circuit further includes a capacitor, a first electrode of the capacitor is connected to the gate of the driving transistor, a second electrode of the capacitor is connected to a power supply line, and the first conductive portion is multiplexed as the first electrode of the capacitor. The display panel further includes a second conductive layer, located between the first conductive layer and the second active layer; the second conductive layer includes a second conductive portion and a first connection portion; an orthographic projection of the second conductive portion on the base substrate at least partially overlaps with an orthographic projection of the first conductive portion on the base substrate; the second conductive portion is configured to form the second electrode of the capacitor. The first direction is a row direction, the second direction is a column direction, each column of the pixel driving circuit is correspondingly provided with a power supply line, and an orthographic projection of the power supply line on the base substrate extends along the column direction. The power supply line includes a first extension portion, a second extension portion, and a third extension portion; the second extension portion is connected between the first extension portion and the third extension portion. A size of an orthographic projection of the second extension portion on the base substrate in the row direction is greater than a size of an orthographic projection of the first extension portion on the base substrate in the row direction, and the size of the orthographic projection of the second extension portion on the base substrate in the row direction is greater than a size of an orthographic projection of the third extension portion on the base substrate in the row direction; where, the first connection portion is connected between two second conductive portions in the same repeating unit; and, in two repeating units adjacent in the first direction, second extension portions in two adjacent power supply lines are connected to each other.

In some embodiments of the present disclosure, the pixel driving circuit further includes a fifth transistor, a first pole of the fifth transistor is connected to the power supply line, and a second pole of the fifth transistor is connected to the first pole of the driving transistor; the first active layer further includes a fifth active portion and an eighth active portion, the fifth active portion is configured to form a channel region of the fifth transistor, and the eighth active portion is connected to an end of the fifth active portion away from the seventh active portion. The display panel further includes a fourth conductive layer located on a side of the third conductive layer away from the base substrate, the fourth conductive layer includes a first bridging portion, and the first bridging portion and the repeating unit are provided correspondingly; the first bridging portion is connected to two eighth active portions in a repeating unit corresponding to the first bridging portion through via holes respectively, the first bridging portion is connected to two power supply lines in the repeating unit corresponding to the first bridging portion through via holes respectively, and the first bridging portion is connected to the first connection portion through a via hole.

In some embodiments of the present disclosure, the first bridging portion includes: a first sub-bridging portion, a second sub-bridging portion, a third sub-bridging portion; an orthographic projection of the first sub-bridging portion on the base substrate extends along the second direction, and a first end of the first sub-bridging portion is connected to the first connection portion through a via hole; a first end of the second sub-bridging portion is connected to a second end of the first sub-bridging portion, an orthographic projection of the second sub-bridging portion on the base substrate extends along the first direction, and a second end of the second sub-bridging portion is connected to the eighth active portion and the power supply line through via holes respectively; a first end of the third sub-bridging portion is connected to the first end of the second sub-bridging portion, an orthographic projection of the third sub-bridging portion on the base substrate extends along the first direction, an orthographic projection of a second end of the third sub-bridging portion on the base substrate is located on a side of an orthographic projection of the first end of the third sub-bridging portion on the base substrate away from the orthographic projection of the second sub-bridging portion on the base substrate, and the second end of the third sub-bridging portion is connected to the eighth active portion and the power supply line through via holes respectively.

In some embodiments of the present disclosure, the third conductive layer further includes a first initial signal line and a second initial signal line; an orthographic projection of the first initial signal line on the base substrate extends along the first direction, the orthographic projection of the first initial signal line on the base substrate at least partially overlaps with an orthographic projection of the first reset signal line on the base substrate; an orthographic projection of the second initial signal line on the base substrate extends along the first direction, and the orthographic projection of the second initial signal line on the base substrate at least partially overlaps with an orthographic projection of the second reset signal line on the base substrate.

In some embodiments of the present disclosure, the pixel driving circuit further includes: a fourth transistor, a fifth transistor, and a capacitor; a first pole of the fourth transistor is connected to a data line, and a second pole of the fourth transistor is connected to the first pole of the driving transistor; a first pole of the fifth transistor is connected to a power supply line, and the second pole of the fifth transistor is connected to the first pole of the driving transistor; a first electrode of the capacitor is connected to the gate of the driving transistor, and a second electrode of the capacitor is connected to the power supply line; where, the first transistor, the driving transistor, the fourth transistor, the fifth transistor, the sixth transistor, and the seventh transistor are P-type transistors, and the second transistor is an N-type transistor.

In some embodiments of the present disclosure, the first active layer further includes a ninth active portion, a twelfth active portion and a thirteenth active portion; the ninth active portion part is connected between the fifth active portion and the seventh active portion; the fourth active portion is connected between the twelfth active portion and the thirteenth active portion; the display panel further includes a fourth conductive layer, and the fourth conductive layer is located on a side of the third conductive layer away from the base substrate; the fourth conductive layer includes a fourth bridging portion and an eighth bridging portion; the fourth bridging portion is connected to the twelfth active portion and the ninth active portion through via holes respectively, and the eighth bridging portion is connected to the thirteenth active portion through a via hole.

According to an aspect of the present disclosure, there is provided a display device, including the above-mentioned display panel.

It should be understood that both the foregoing general description and the following detailed description are exemplary and explanatory only and are not limitation of the present disclosure.

BRIEF DESCRIPTION OF THE DRAWINGS

The accompanying drawings here, which are incorporated in and constitute a part of the description, illustrate embodiments consistent with the disclosure and together with the description serve to explain the principles of the disclosure. Obviously, the drawings in the following description are some embodiments of the present disclosure, and for those of ordinary skill in the art, other drawings can also be obtained from these drawings without creative efforts.

DETAILED DESCRIPTION

Figure 1:
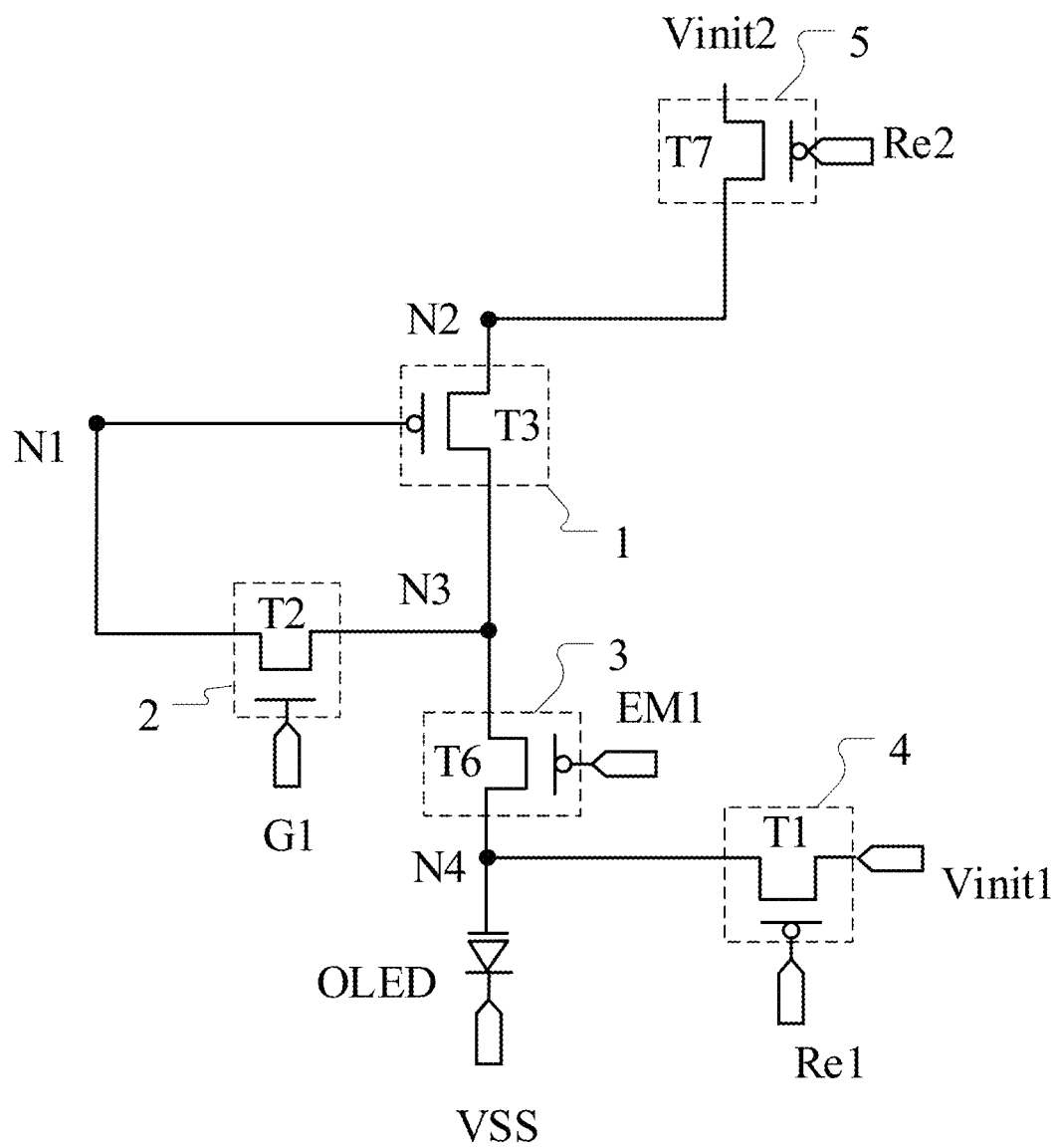
FIG. 1 is a schematic structural diagram of a pixel driving circuit according to some embodiments of the present disclosure.

Example embodiments will now be described more fully with reference to the accompanying drawings. Example embodiments, however, can be implemented in various forms and should not be construed as limitation to the embodiments set forth here; by contrast, these embodiments are provided so that the present disclosure will be thorough and complete, and will fully convey the concept of example embodiments to those skilled in the art. The same reference numerals in the drawings denote the same or similar structures, and thus their detailed descriptions will be omitted.

The terms "a", "an" and "the" are configured to indicate the presence of one or more elements/components/etc. The terms "including" and "comprising" are configured to indicate the meaning of open inclusion and refer to existence of additional elements/components/etc. in addition to the listed elements/components/etc.

The display panel generally includes a pixel driving circuit and a light-emitting unit. The pixel driving circuit is configured to drive the light-emitting unit to emit light. The pixel driving circuit generally includes a driving transistor. In the light-emitting stage of the light-emitting unit, the driving transistor is in a voltage-biased state for a long time, which can easily lead to hysteresis phenomenon in the driving transistor. The hysteresis phenomenon of the driving transistor can cause the threshold value of the driving transistor to drift, thus affecting the display effect of the display panel.

Based on this, there is provided a pixel driving circuit according to some embodiments of the present disclosure, as shown in FIG. 1, which is a schematic structural diagram of the pixel driving circuit according to the present disclosure. The pixel driving circuit may include: a driving circuit 1, a compensation circuit 2, a first light-emitting control circuit 3, a first reset circuit 4, and a second reset circuit 5. The driving circuit 1 is connected to a first node N1, a second node N2, and a third node N3, and is configured to input a driving current to the third node N3 through the second node N2 according to a signal of the first node N1. The compensation circuit 2 is connected to the first node N1, the third node N3, and a first gate driving signal end G1, and is configured to turn on the first node N1 and the third node N3 in response to a signal of the first gate driving signal end G1. The first light-emitting control circuit 3 is connected to the third node N3, a fourth node N4, and a first enabling signal end EM1, and is configured to communicate with the third node N3 and the fourth node N4 in response to a signal of the first enabling signal end EM1. The first reset circuit 4 is connected to the fourth node N4, a first initial signal end Vinit1, and a first reset signal end Re1, and is configured to transmit a signal of the first initial signal end Vinit1 to the fourth node N4 in response to a signal of the first reset signal end Re1. The second reset circuit 5 is connected to the second node N2, a second initial signal end Vinit2, and a second reset signal end Re2, and is configured to transmit a signal of the second initial signal end Vinit2 to the second node N2 in response to a signal of the second reset signal end Re2.

As shown in FIG. 1, the fourth node N4 can be configured to be connected to a first electrode of the light-emitting unit OLED, and a second electrode of the light-emitting unit OLED can be connected to a second power supply end VSS. In some embodiments, the active level is a level capable of conducting the target circuit; for example, the active level corresponding to a P-type transistor is low level, and the active level corresponding to a N-type transistor is high level.

The driving method for the pixel driving circuit may at least include a first reset phase and a hysteresis elimination phase. In the first reset phase, an active level can be input to the first reset signal end Re1 and the second reset signal end Re2, thus inputting an initial signal to the fourth node N4 through the first initial signal end Vinit1, and inputting an initial signal to the second node N2 through the second initial signal end Vinit2. In the hysteresis elimination phase, an active level can be input to the first reset signal end Re1, the first enabling signal end EM1, and the first gate driving signal end G1, thus inputting an initial signal to the first node N1 through the first initial signal end Vinit1. According to the pixel driving circuit provided in some embodiments, the second node N2 can be reset in the first reset phase, and the first node N1 can be reset in the hysteresis elimination phase, so that the pixel driving circuit can effectively improve the hysteresis of the driving circuit 1.

In some embodiments, the driving circuit includes a driving transistor T3, a first pole of the driving transistor T3 is connected to the second node N2, a second pole is connected to the third node N3, and a gate is connected to the first Node N1. The compensation circuit 2 includes a second transistor T2, a first pole of the second transistor T2 is connected to the first node N1, a second pole is connected to the third node N3, and a gate is connected to the first gate driving signal end G1. The first light-emitting control circuit 3 includes a sixth transistor T6, a first pole of the sixth transistor T6 is connected to the third node N3, a second pole is connected to the fourth node N4, and a gate is connected to the first enabling signal end EM1. The first reset circuit 4 includes a first transistor T1, a first pole of the first transistor T1 is connected to the first initial signal end Vinit1, and a second pole is connected to the first Four nodes N4, and a gate is connected to the first reset signal end Re1. The second reset circuit 5 includes a seventh transistor T7, a first pole of the seventh transistor T7 is connected to the second initial signal end Vinit2, a second pole is connected to the second node N2, and a gate is connected to the second reset signal end Re2.

In some embodiments, the second transistor T2 may be an N-type transistor, and the driving transistor T3 may be a P-type transistor. The N-type transistor has a smaller leakage current, so that such configuration can reduce the leakage current of the first node N1. The P-type transistor has a higher carrier mobility, so that the pixel driving circuit is beneficial to realize a display panel with high resolution, high response speed and high pixel density.

Figure 2:
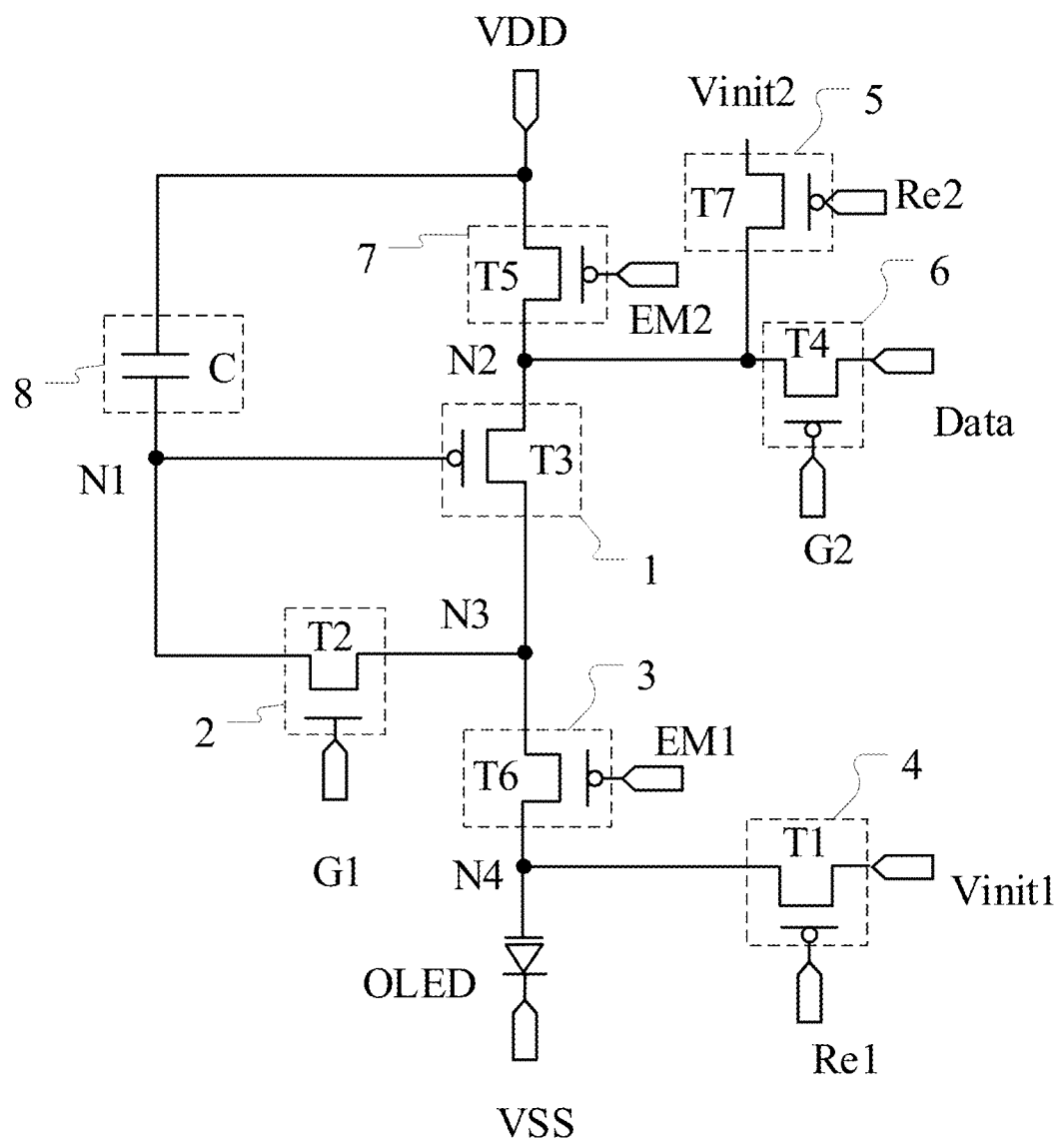
FIG. 2 is a schematic structural diagram of a pixel driving circuit according to some embodiments of the present disclosure.

As shown in FIG. 2, it is a schematic structural diagram of the pixel driving circuit according to some embodiments of the present disclosure. The pixel driving circuit may further include: a data writing circuit 6, a second light-emitting control circuit 7, and a storage circuit 8. The data writing circuit 6 is connected to the second node N2, a data signal end Data, and a second gate driving signal end G2, and is configured to transmit a signal of the data signal end Data to the second node N2 in response to a signal of the second gate driving signal end G2. The second light-emitting control circuit 7 is connected to a first power supply end VDD, the second node N2, and a second enabling signal end EM2, and is configured to transmit a signal of the first power supply end VDD to the second node N2 in response to a signal of the second enabling signal end EM2. The storage circuit 8 is connected between the first node N1 and the first power supply end VDD.

In some embodiments, the data writing circuit 6 includes a fourth transistor T4, a first pole of the fourth transistor T4 is connected to the data signal end Data, a second pole is connected to the second node N2, and a gate is connected to the second gate driving signal end G2. The second light-emitting control circuit 7 includes a fifth transistor T5, a first pole of the fifth transistor T5 is connected to the first power supply end VDD, a second pole is connected to the second node N2, and a gate is connected to the second enabling signal end EM2. The storage circuit 8 includes a capacitor C, a first electrode of the capacitor C is connected to the first node N1, and a second electrode is connected to the first power supply end VDD.

In some embodiments, the first transistor T1, the fourth transistor T4, the fifth transistor T5, the sixth transistor T6, and the seventh transistor T7 can all be P-type transistors. The first power supply end VDD can be at a high level, and the second power supply end VSS can be at a low level.

Figure 3:
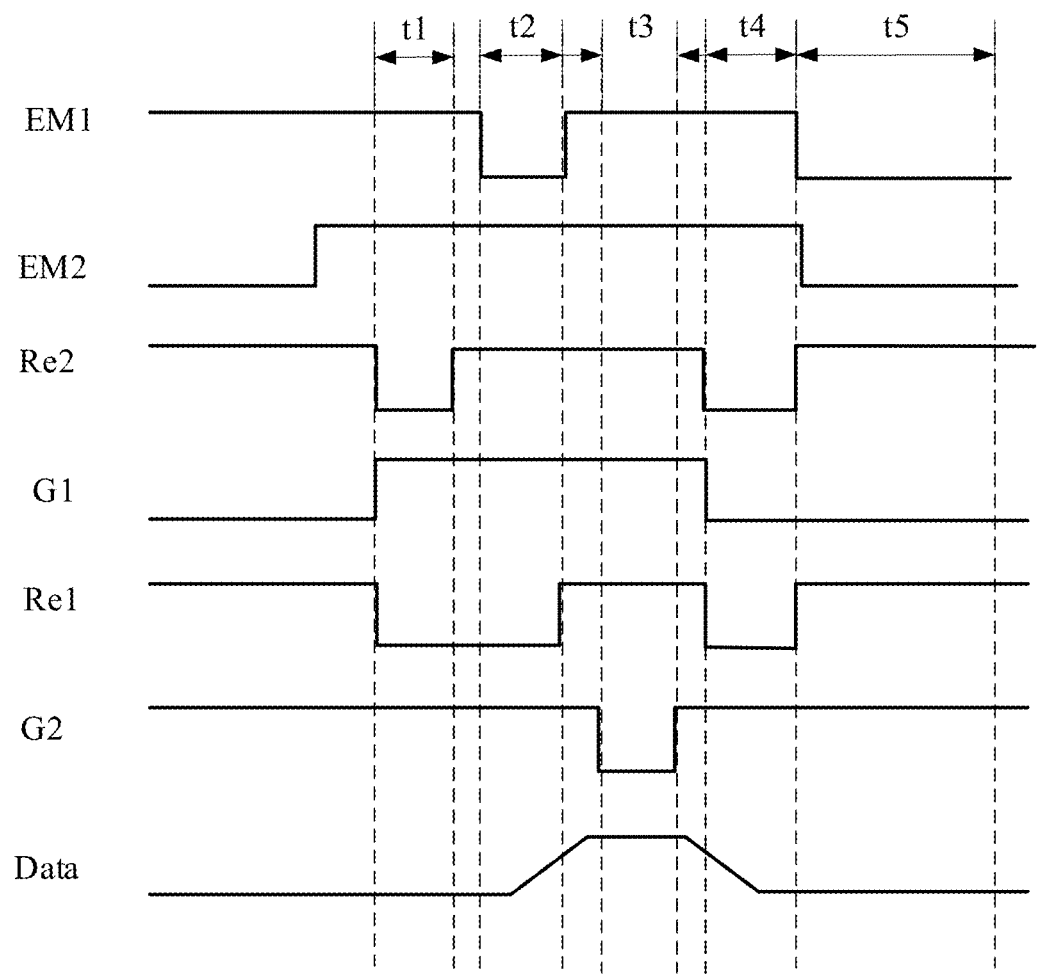
FIG. 3 is a timing diagram of each control signal in a driving method for the pixel driving circuit shown in FIG. 2.

As shown in FIG. 3, it is a timing diagram of each control signal in the driving method for the pixel driving circuit shown in FIG. 2. Among them, EM1 is the timing diagram of the signal on the first enabling signal end; EM2 is the timing diagram of the signal on the second enabling signal end; Re1 is the timing diagram of the signal on the first reset signal end; Re2 is the timing diagram of the signal on the second reset signal end; G1 is the timing diagram of the signal on the first gate driving signal end; G2 is the timing diagram of the signal on the second gate driving signal end; and, Data is the timing diagram of the signal on the data signal end.

The driving method for the pixel driving circuit may include a first reset phase t1, a hysteresis elimination phase t2, a data writing phase t3, a second reset phase t4, and a light-emitting phase t5. In the first reset phase t1, the first enabling signal end EM1, the second enabling signal end EM2, the first gate driving signal end G1, and the second gate driving signal end G2 output high-level signals, and the first reset signal end Re1 and the second reset signal end Re2 output low-level signals; the first transistor T1, the seventh transistor T7, and the second transistor T2 are turned on; the fourth transistor T4, the fifth transistor T5, and the sixth transistor T6 are turned off; the first initial signal end Vinit1 inputs an initial signal to the fourth node N4, and the second initial signal end Vinit2 inputs an initial signal to the second node N2. In the hysteresis elimination phase t2, the second enabling signal end EM2, the second reset signal end Re2, the first gate driving signal end G1, and the second gate driving signal end G2 output high levels, and the first enabling signal end EM1 and the first reset signal end Re1 output low-level signals; the sixth transistor T6, the first transistor T1, and the second transistor T2 are turned on; the fourth transistor T4, the fifth transistor T5, and the seventh transistor T7 are turned off; the first initial signal end Vinit1 inputs an initial signal to the first node N1 through the first transistor T1, the sixth transistor T6 and the second transistor T2. In the data writing phase t3, the first enabling signal end EM1, the second enabling signal end EM2, the second reset signal end Re2, the first gate driving signal end G1, and the first reset signal end Re1 output high levels, and the second gate driving signal end G2 outputs a low-level signal; the fourth transistor T4 and the second transistor T2 are turned on; the data signal end inputs a voltage Vdata+Vth to the first node through the fourth transistor T4 and the second transistor T2, where Vdata is the voltage of the data signal, and Vth is the threshold voltage of the driving transistor T3. In the second reset phase t4, the first enabling signal end EM1, the second enabling signal end EM2, and the second gate driving signal end G2 output high-level signals, and the second reset signal end Re2, the first gate driving signal end G1 and the first reset signal end Re1 output low-level signals; the first transistor T1 and the seventh transistor T7 are turned on; the first initial signal end Vinit1 inputs the initial signal to the fourth node N4 again, and the second initial signal end Vinit2 inputs the initial signal to the second node N2 again. In the light-emitting phase t5, the second reset signal end Re2, the first reset signal end Re1, and the second gate driving signal end G2 output high-level signals;

the first enabling signal end EM1, the second enabling signal end EM2, and the first gate driving signal end G1 outputs low levels; the fifth transistor T5 and the sixth transistor T6 are turned on; the driving transistor T3 emits light under the action of the voltage Vdata+Vth stored in the capacitor C.

The formula for the output current of the driving transistor is as follows:

$$I=(\mu W C_{ox}/2L)(V_{gs}-V_{th})2,$$

Among them, I is the output current of the driving transistor; u is the carrier mobility; Cox is the gate capacitance per unit area; W is the channel width of the driving transistor; L is the channel length of the driving transistor; Vgs is the gate-source voltage difference of the driving transistor; Vth is the threshold voltage of the driving transistor.

According to the above formula for the output current of the driving transistor, the gate voltage Vdata+Vth and the source voltage Vdd of the driving transistor in the pixel driving circuit of the present disclosure can be brought into the above formula to obtain the output current of the driving transistor in the pixel driving circuit of the present disclosure: I=(μWCox/2L) (Vdata+Vth-Vdd-Vth) 2. The pixel driving circuit can avoid the effect of the threshold of the driving transistor on its output current.

In some embodiments, the second initial signal end Vinit2 resets the source of the driving transistor T3 again in the second reset phase t4, so that the hysteresis phenomenon of the driving transistor T3 can be further improved. It should be understood that, in other example embodiments, the driving method for the pixel driving circuit may not include the second reset phase. In other example embodiments, in the hysteresis elimination phase, the first initial signal end and the second initial signal end may reset the first node and the second node respectively during a same period.

According to some embodiments of the present disclosure, there is further provided a display panel. The display panel may include a base substrate, a shielding layer, a first active layer, a first conductive layer, a second conductive layer, a second active layer, a third conductive layer, a fourth conductive layer, a fifth conductive layer, and an electrode layer, which are sequentially provided in stack, where an insulating layer may be provided between the above-mentioned adjacent layers.

Figure 6:
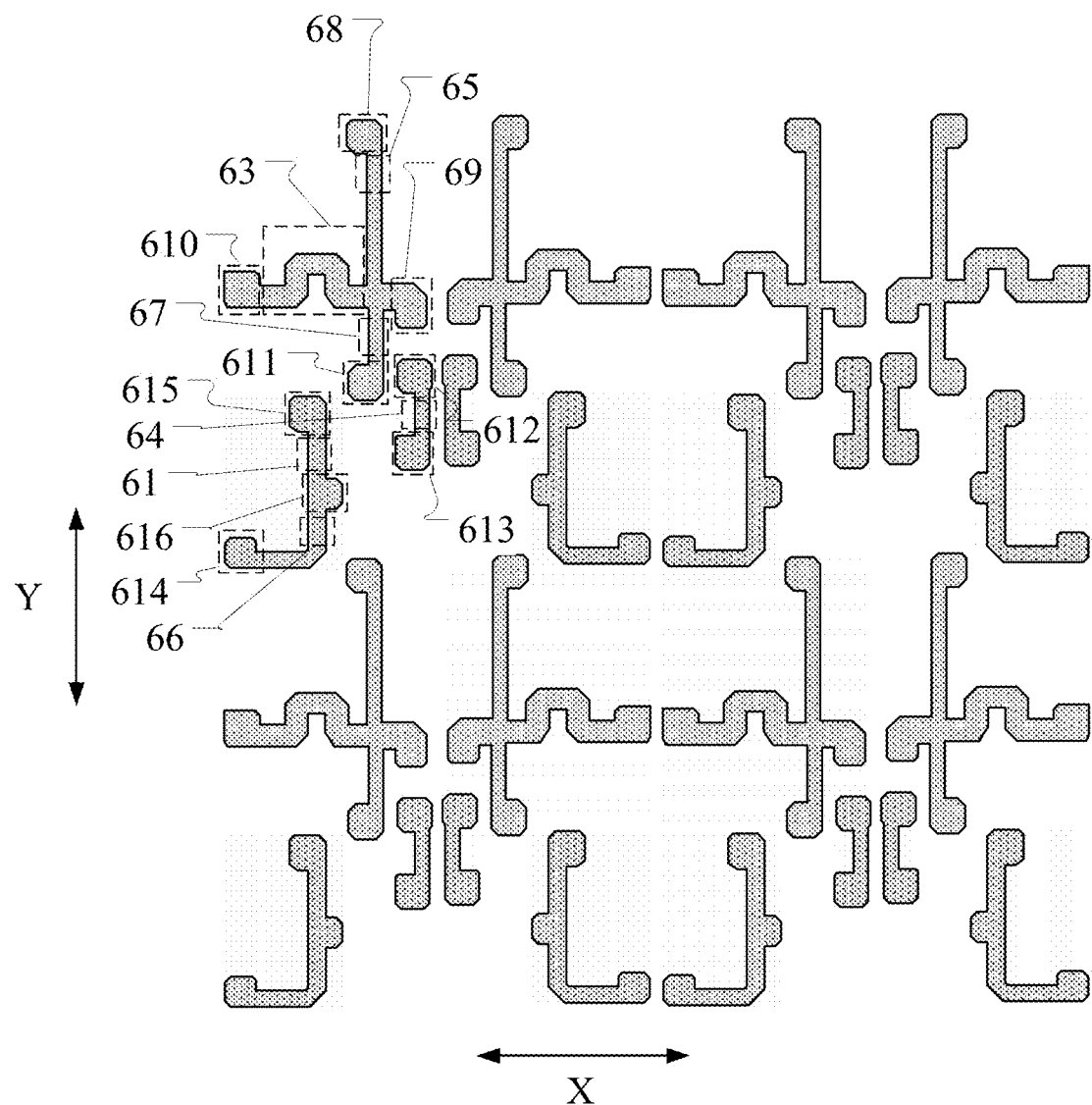
FIG. 6 is a structural layout of the first active layer in FIG. 4.
Figure 7:
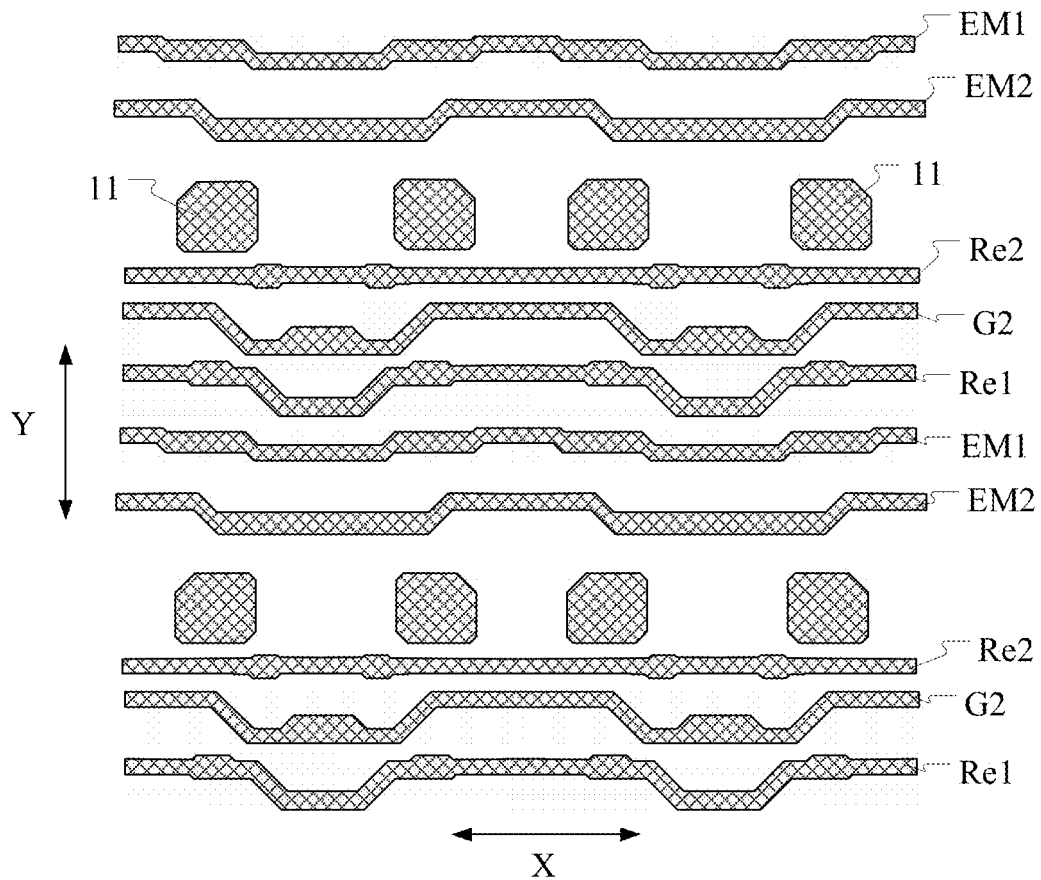
FIG. 7 is a structural layout of the first conductive layer in FIG. 4.
Figure 8:
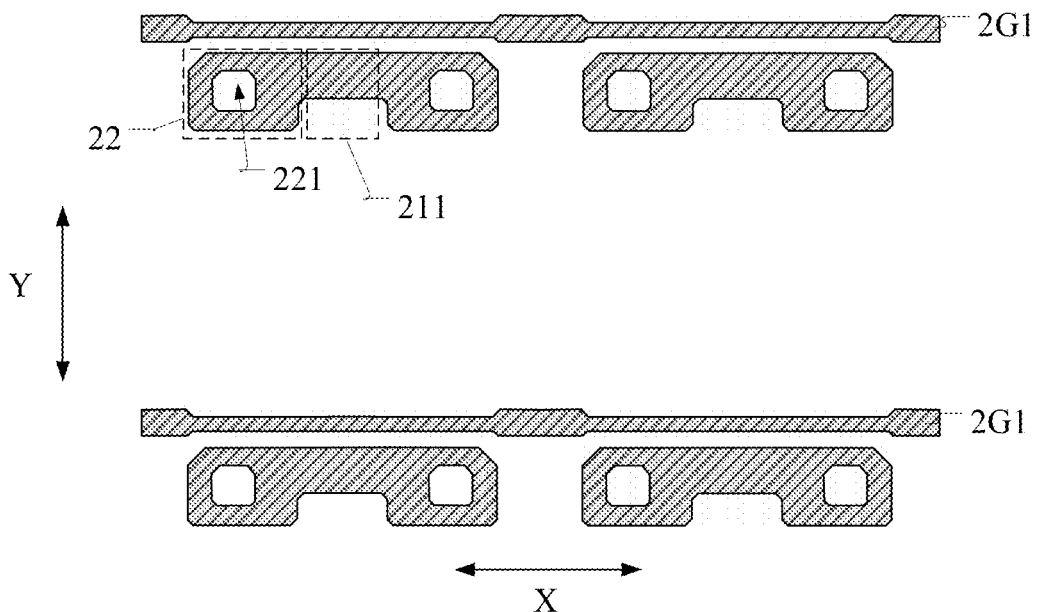
FIG. 8 is a structural layout of the second conductive layer in FIG. 4.
Figure 9:
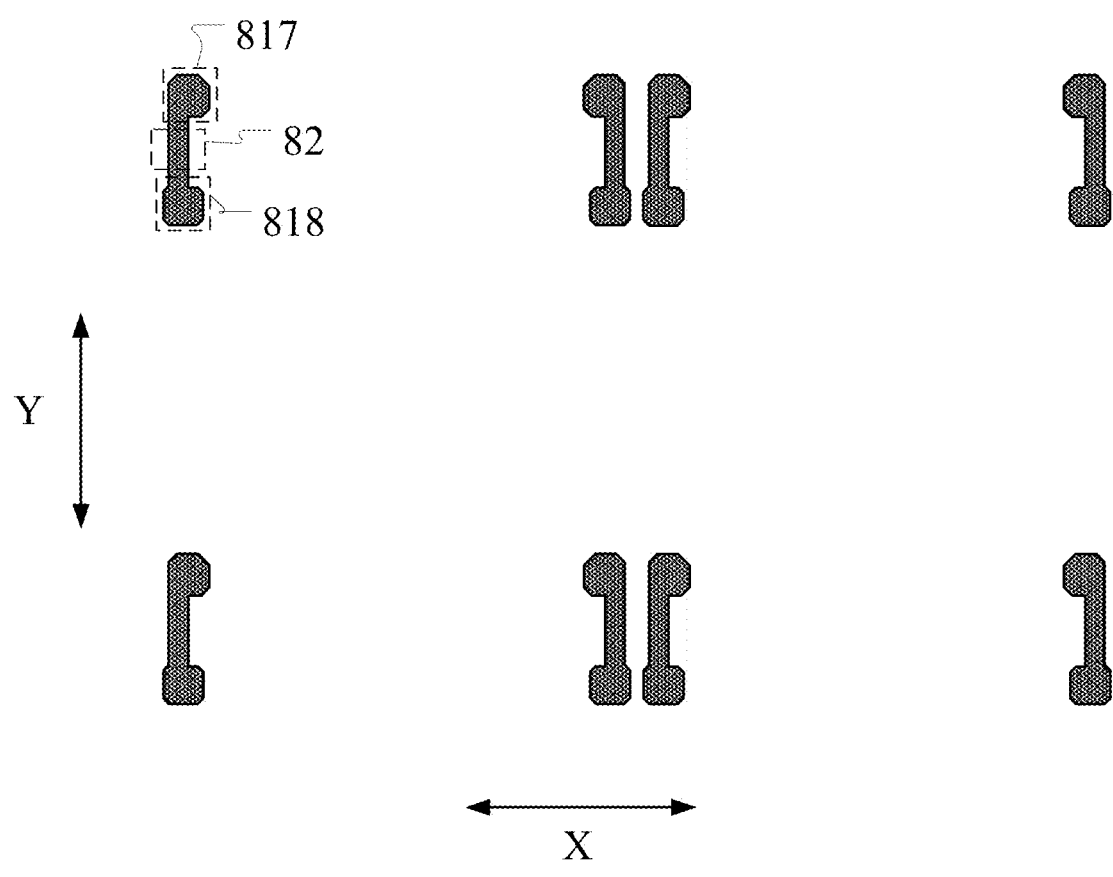
FIG. 9 is a structural layout of the second active layer in FIG. 4.
Figure 10:
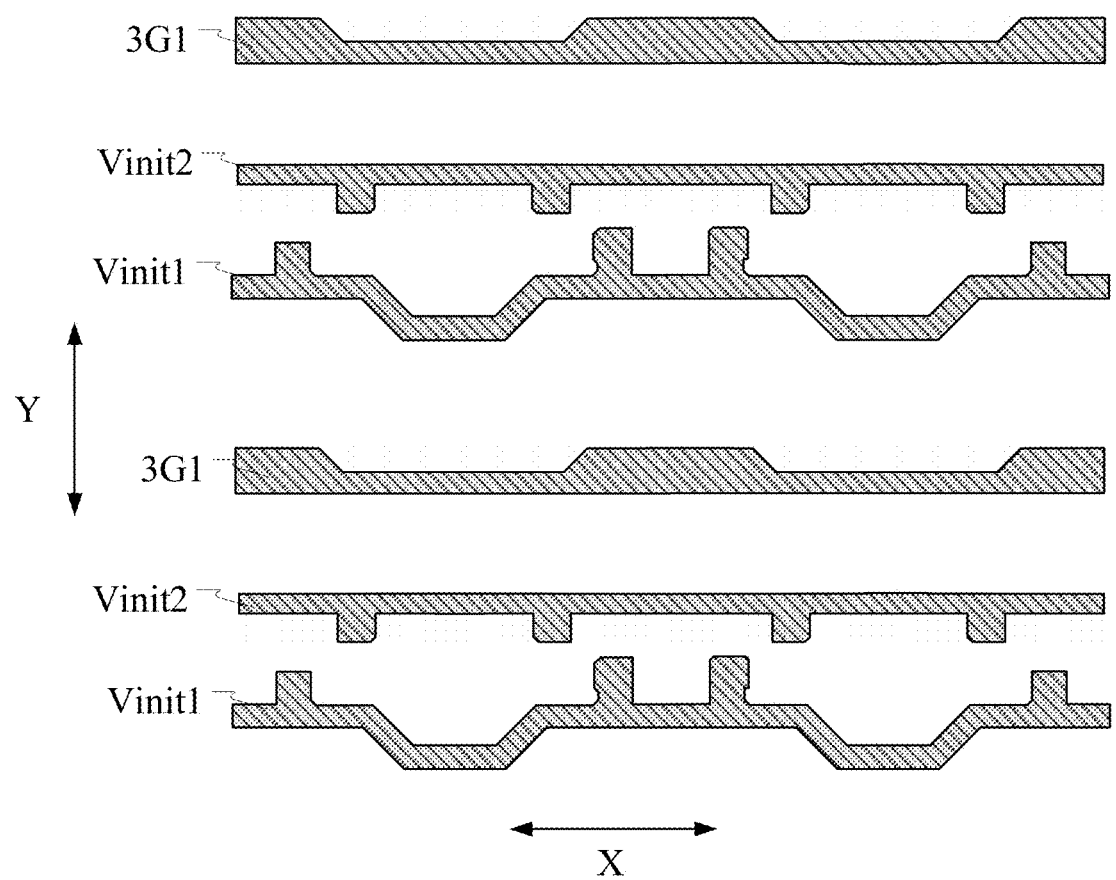
FIG. 10 is a structural layout of the third conductive layer in FIG. 4.
Figure 11:
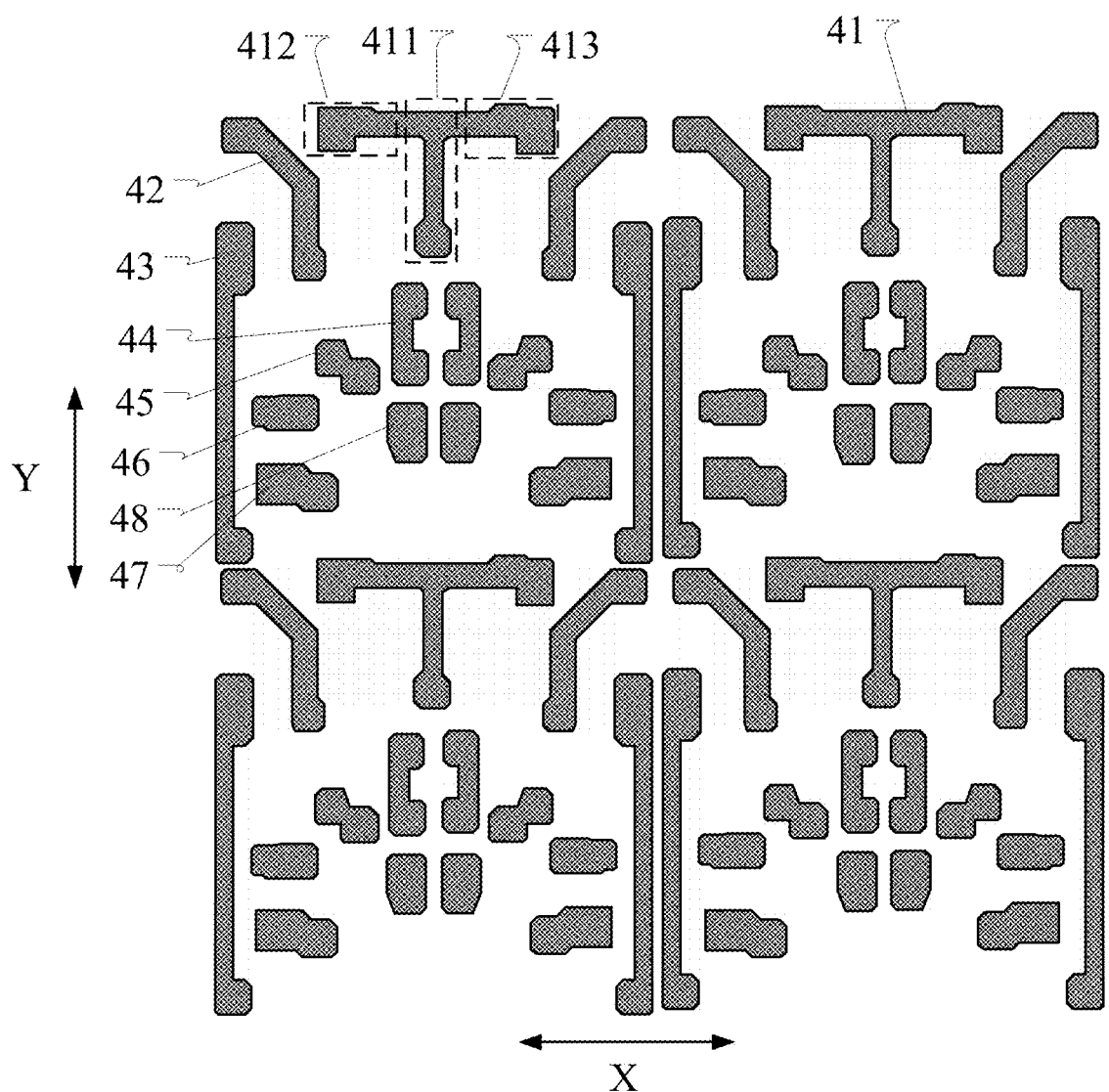
FIG. 11 is a structural layout of the fourth conductive layer in FIG. 4.
Figure 12:
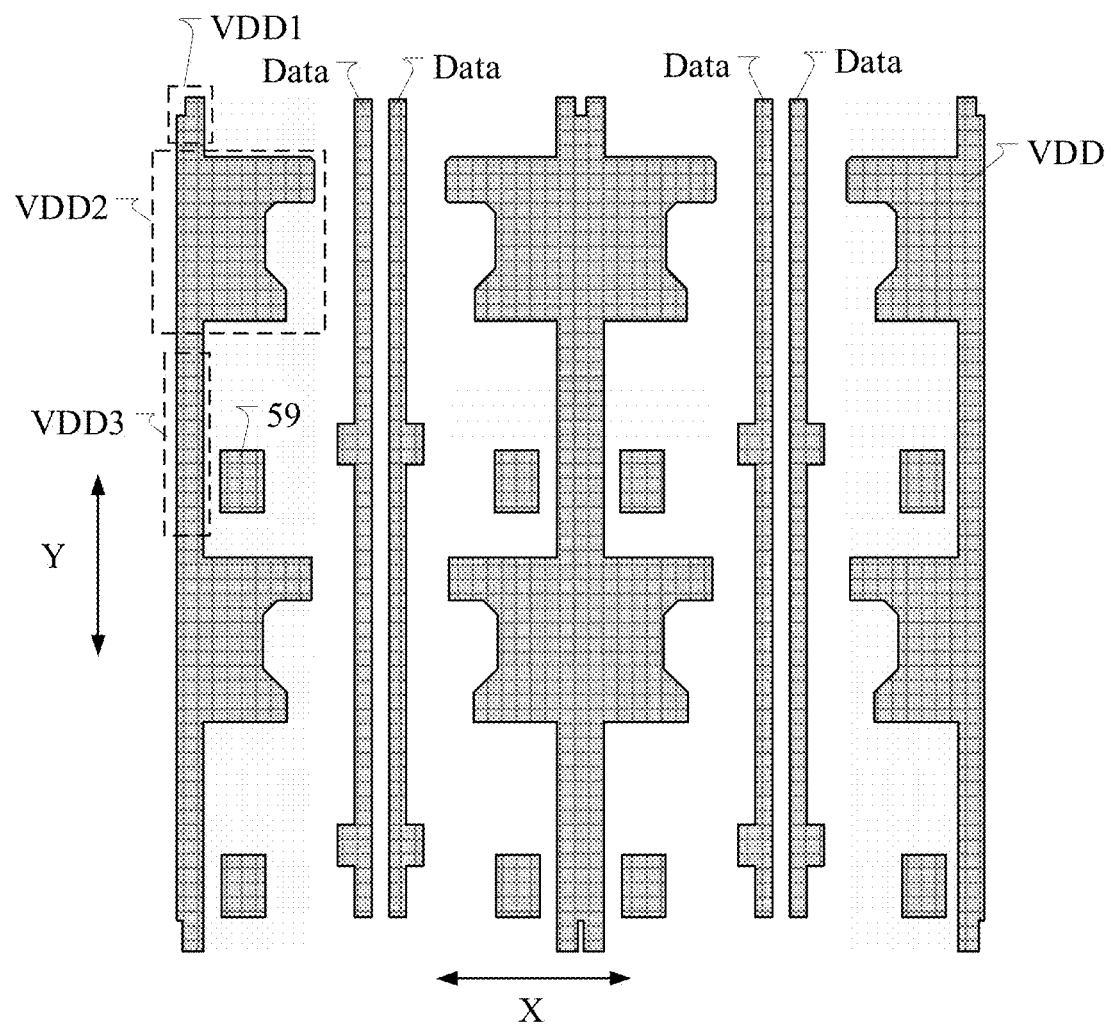
FIG. 12 is a structural layout of the fifth conductive layer in FIG. 4.
Figure 13:
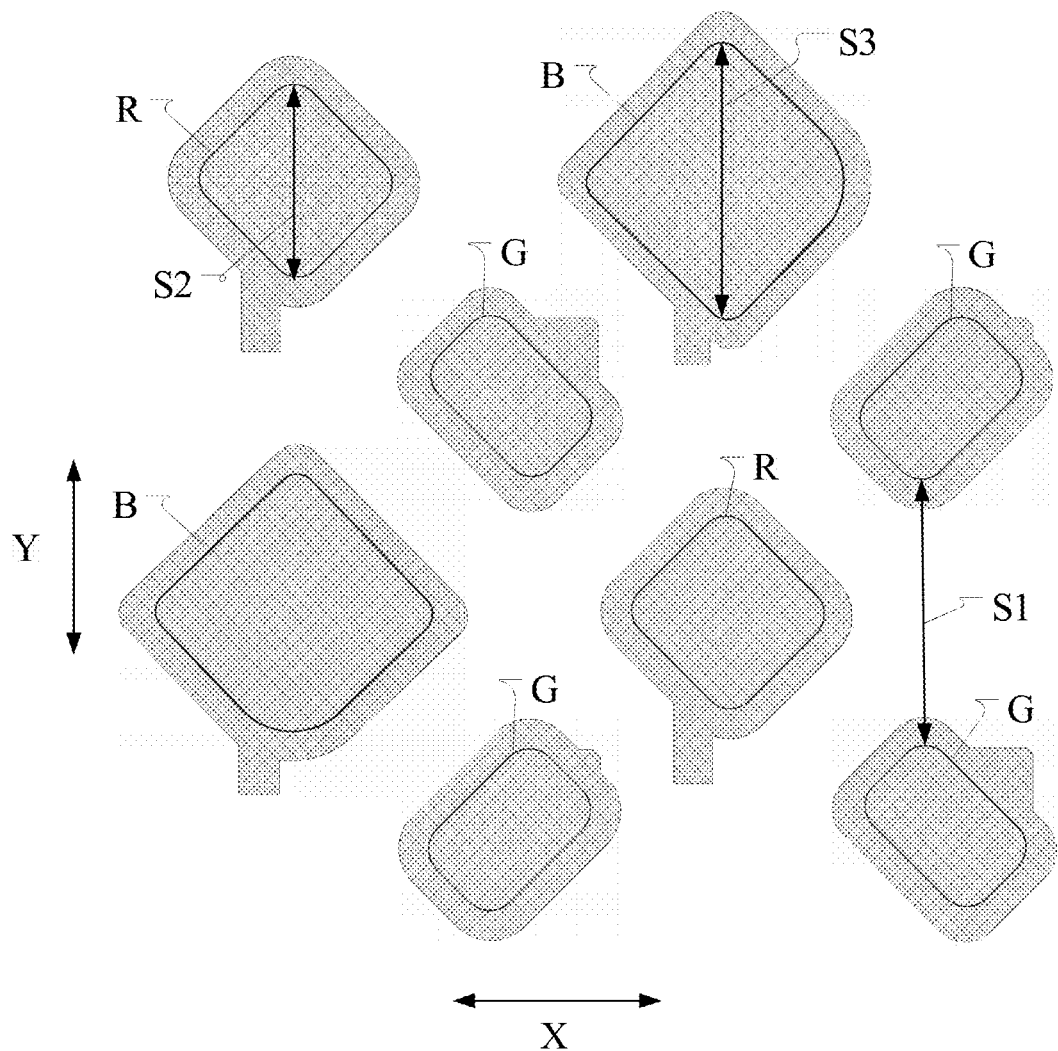
FIG. 13 is the structural layout of the electrode layer in FIG. 4.
Figure 14:
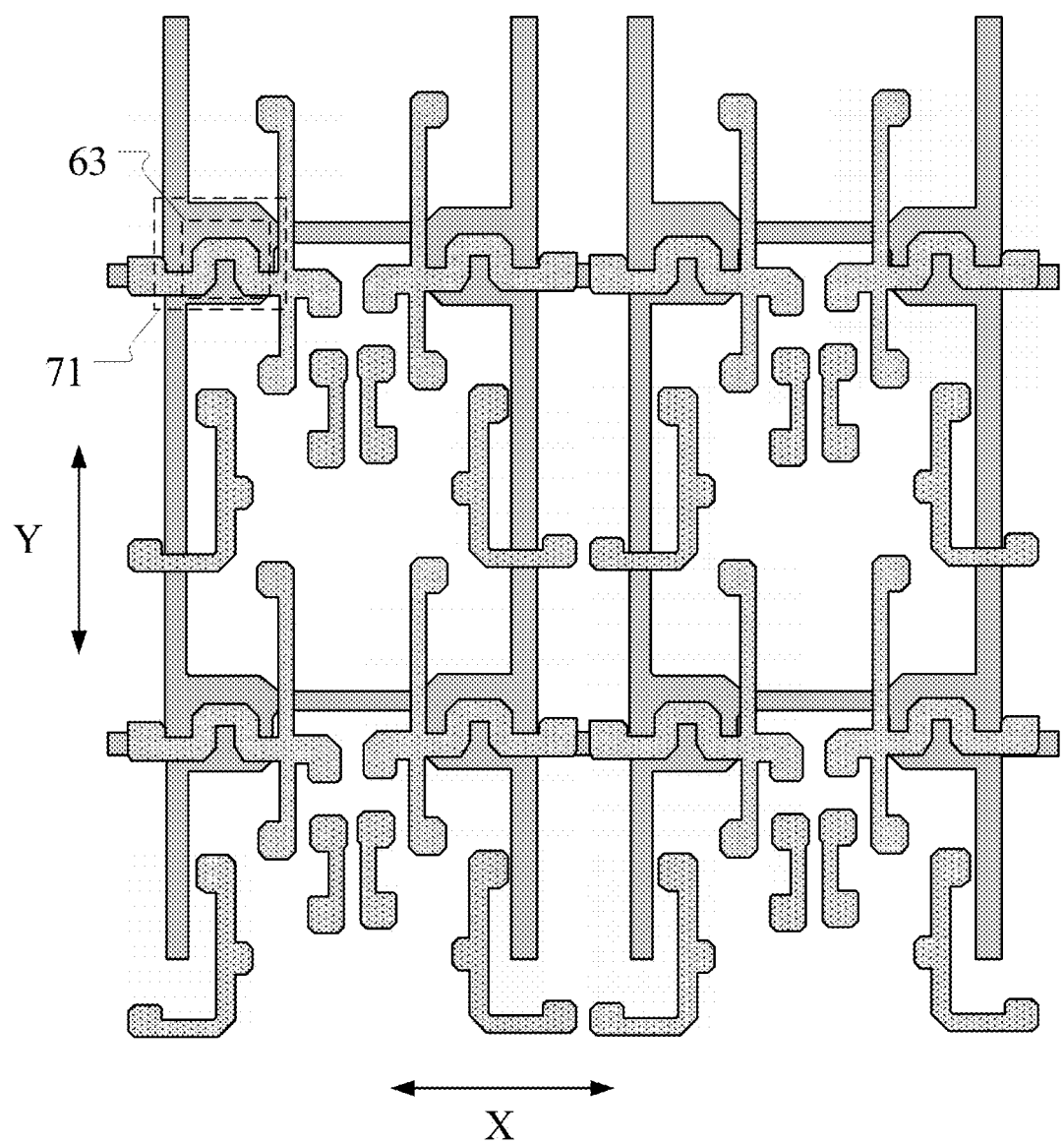
FIG. 14 is a structural layout of the shielding layer and the first active layer in FIG. 4.
Figure 15:
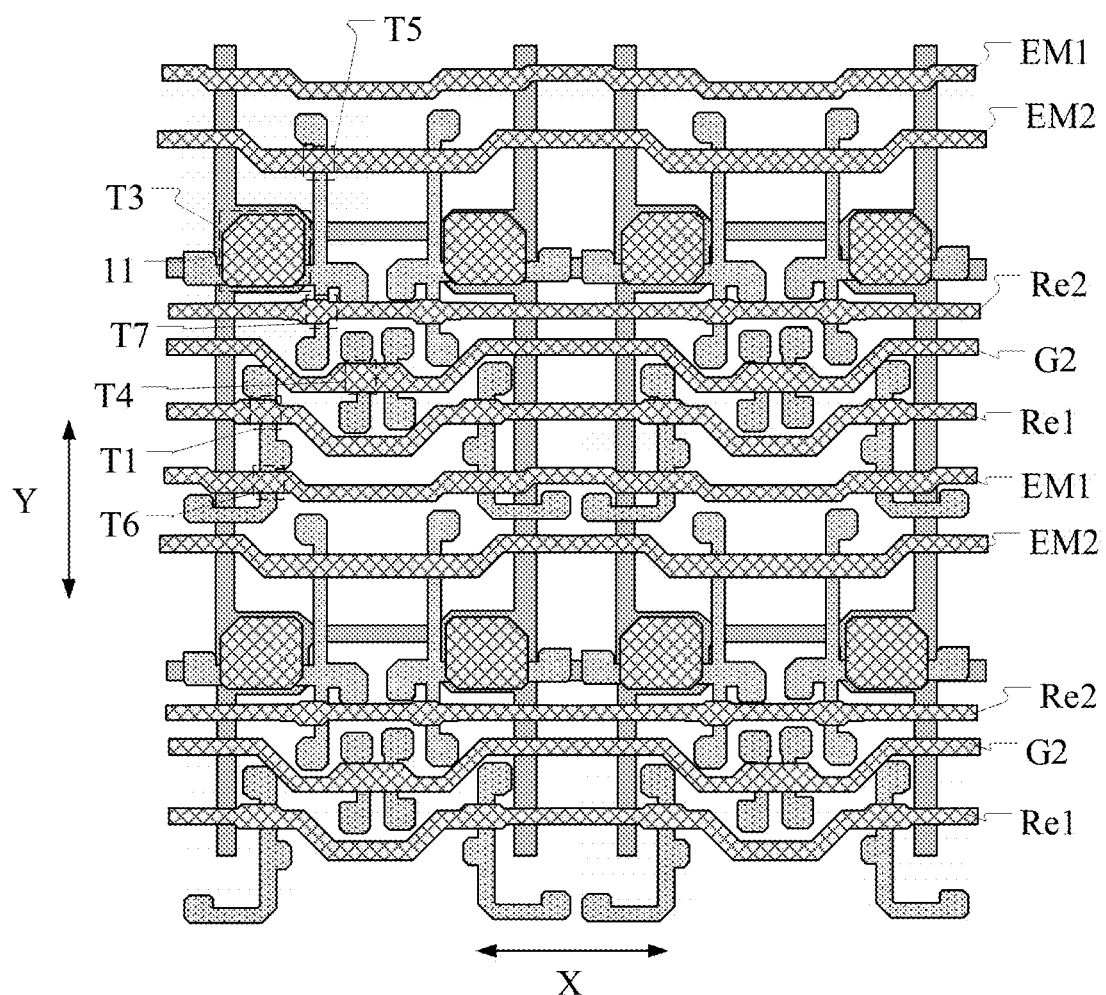
FIG. 15 is a structural layout of the shielding layer, the first active layer, and the first conductive layer in FIG. 4.
Figure 16:
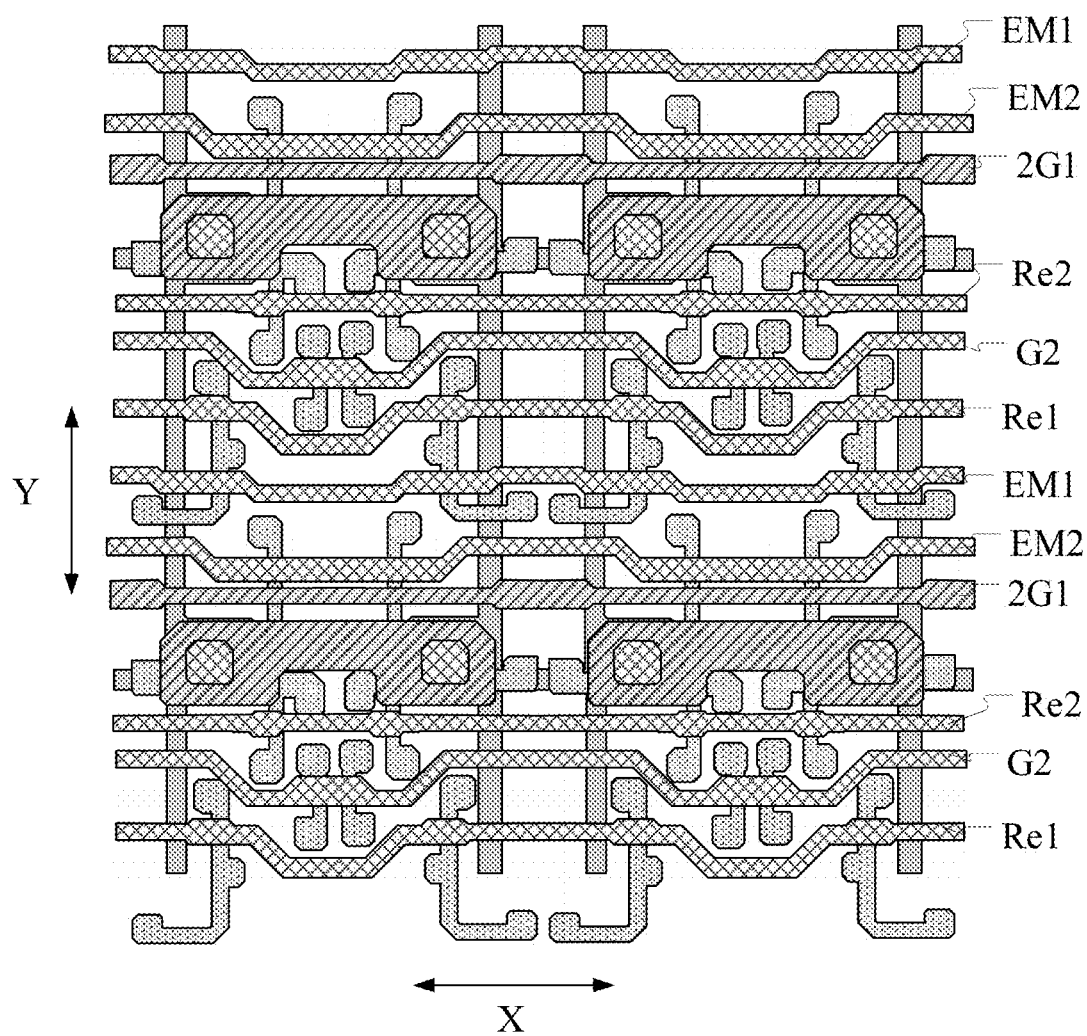
FIG. 16 is a structural layout of the shielding layer, the first active layer, the first conductive layer, and the second conductive layer in FIG. 4.
Figure 17:
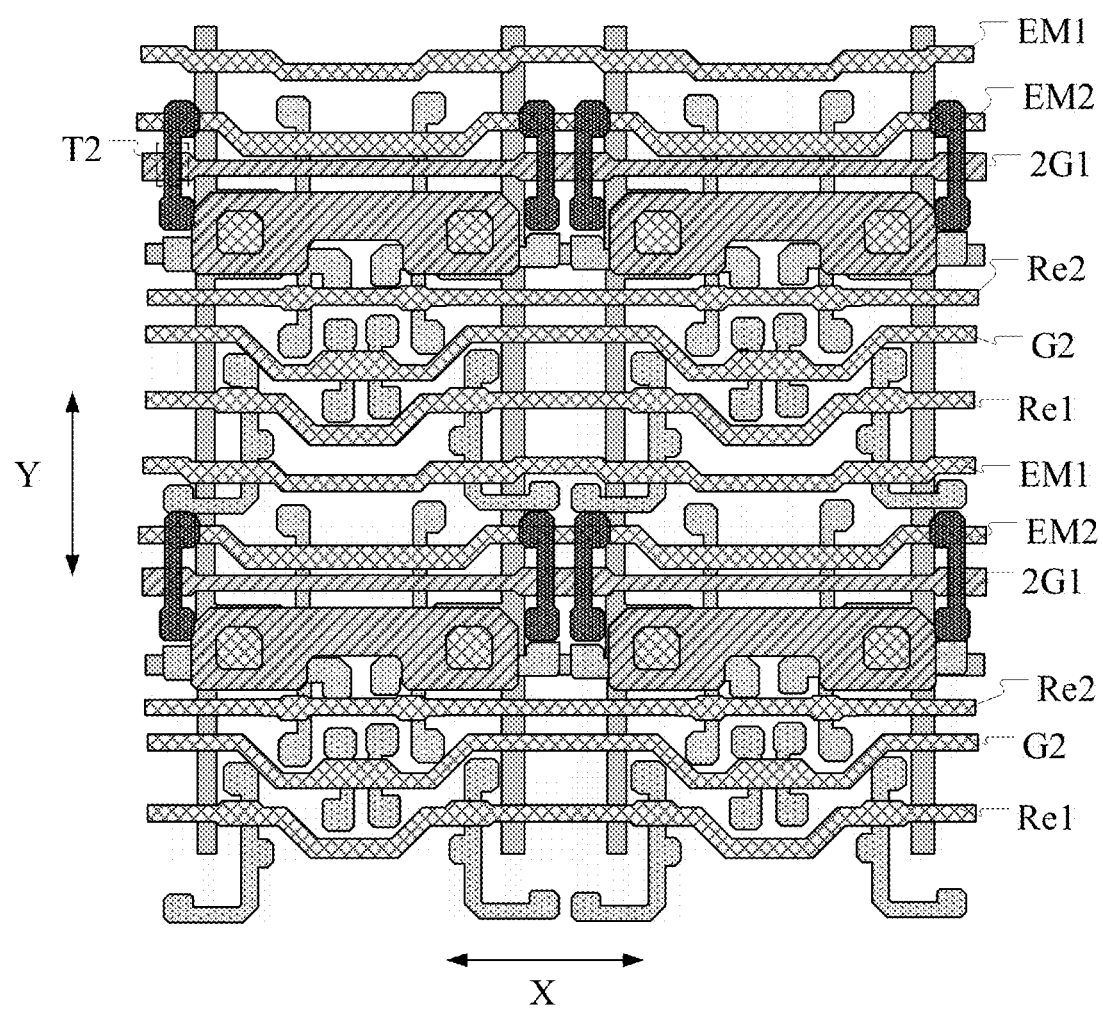
FIG. 17 is a structural layout of the shielding layer, the first active layer, the first conductive layer, the second conductive layer, and the second active layer in FIG. 4.
Figure 18:
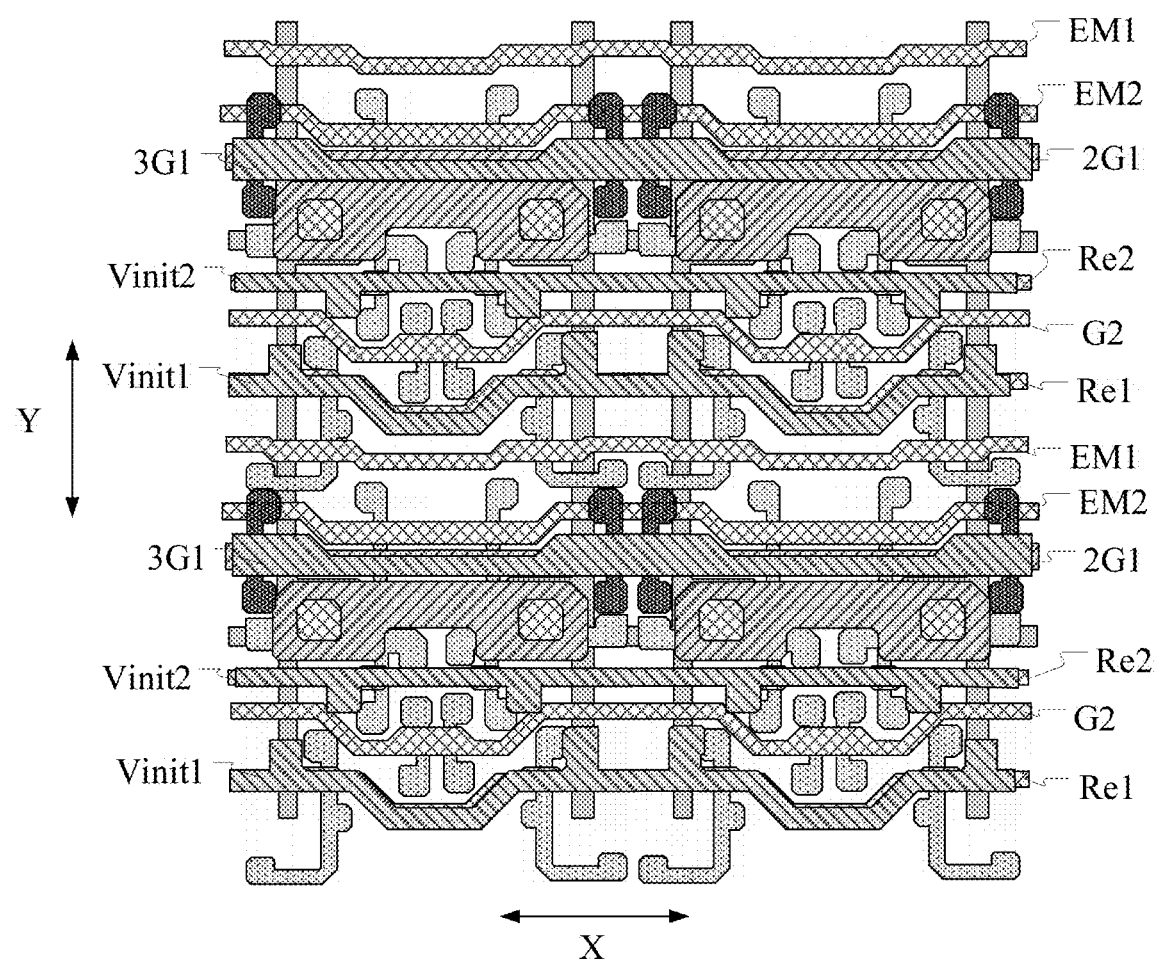
FIG. 18 is a structural layout of the shielding layer, the first active layer, the first conductive layer, the second conductive layer, the second active layer, and the third conductive layer in FIG. 4.
Figure 19:
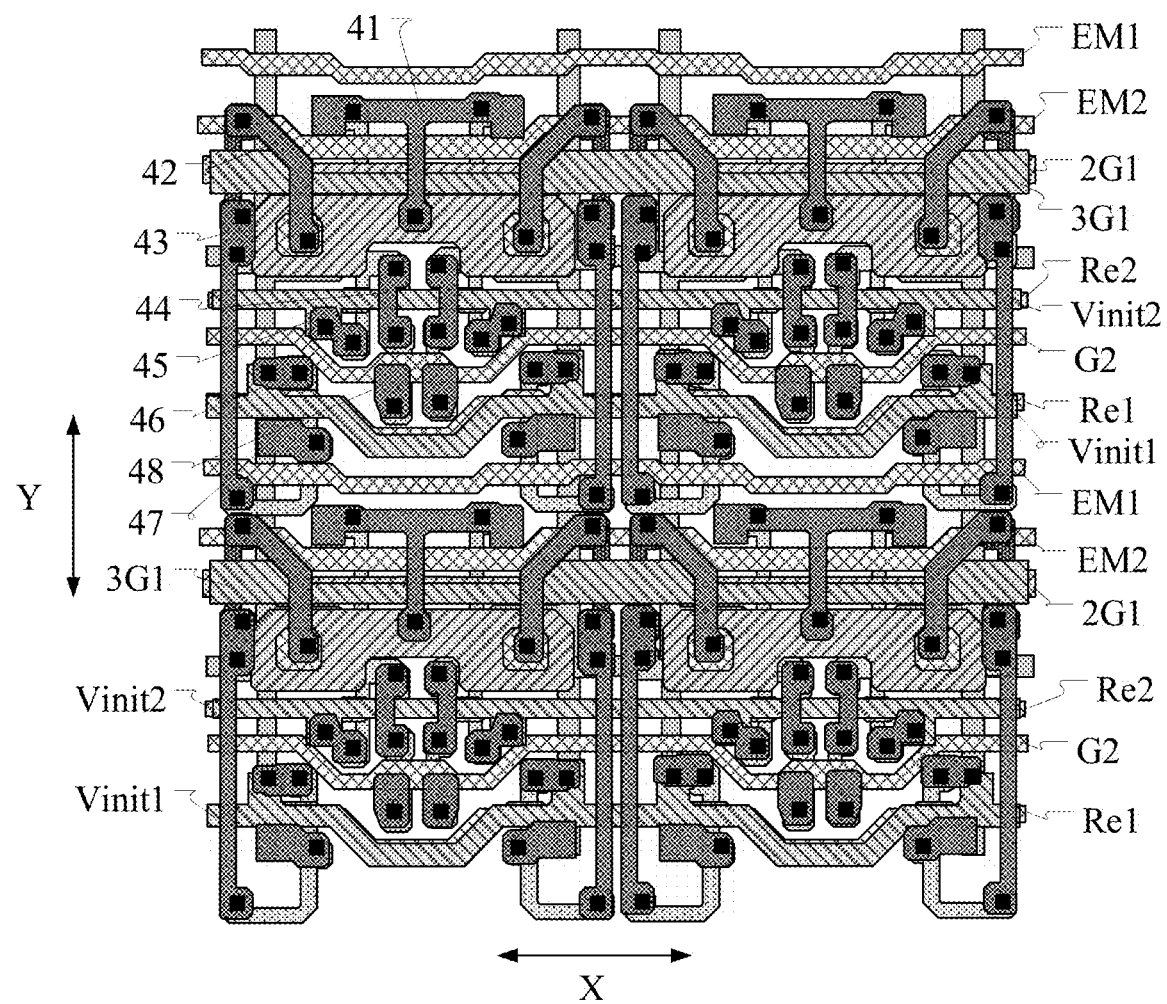
FIG. 19 is a structural layout of the shielding layer, the first active layer, the first conductive layer, the second conductive layer, the second active layer, the third conductive layer, and the fourth conductive layer in FIG. 4.
Figure 20:
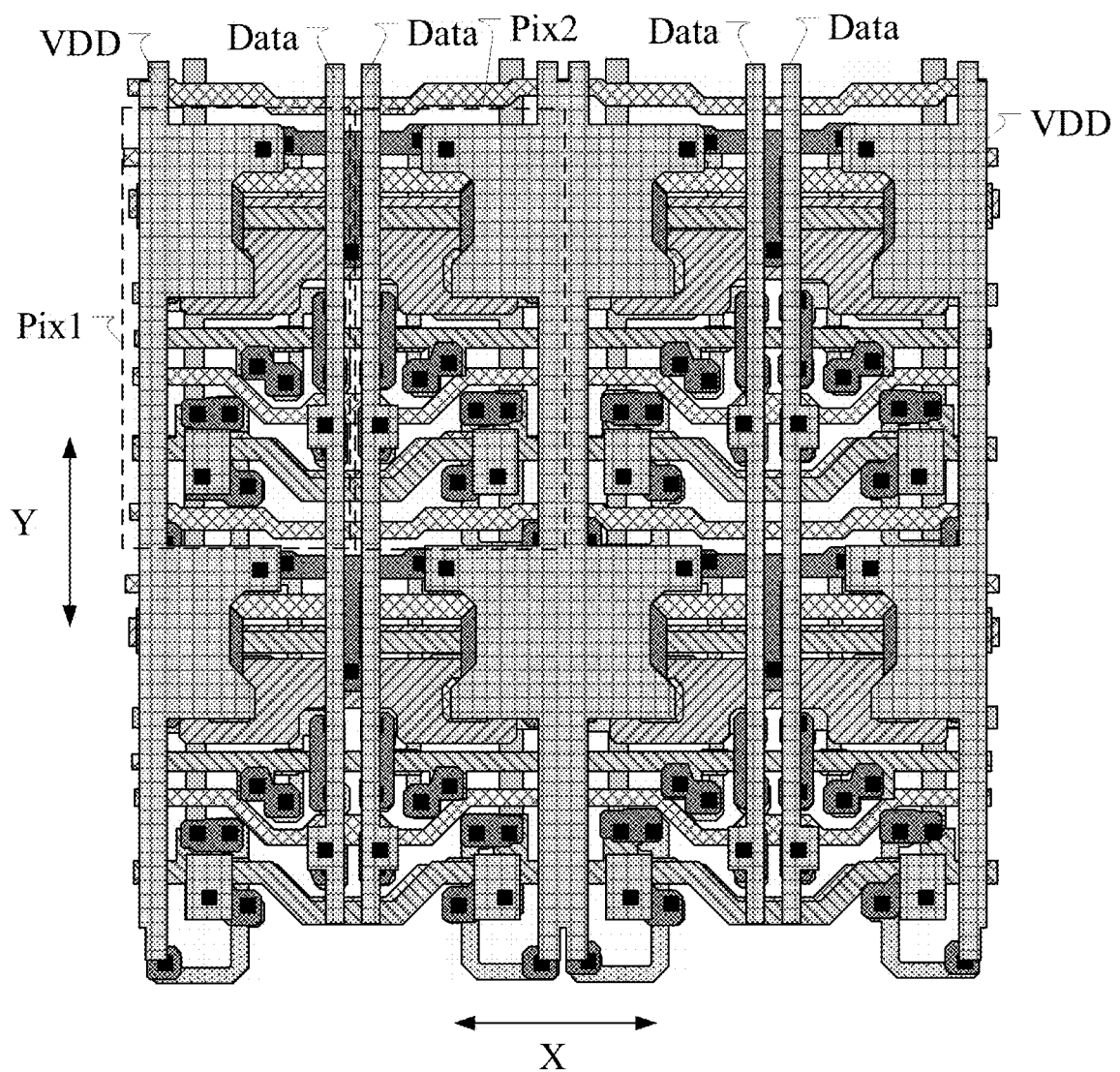
FIG. 20 is a structural layout of the shielding layer, the first active layer, the first conductive layer, the second conductive layer, the second active layer, the third conductive layer, the fourth conductive layer, and the fifth conductive layer in FIG. 4.

As shown in FIG. 4-FIG. 20, FIG. 4 is the structural layout of the display panel according to some embodiments of the present disclosure; FIG. 5 is the structural layout of the shielding layer in FIG. 4; FIG. 6 is the structural layout of the first active layer in FIG. 4; FIG. 7 is the structural layout of the first conductive layer in FIG. 4; FIG. 8 is the structural layout of the second conductive layer in FIG. 4; FIG. 9 is the structural layout of the second active layer in FIG. 4; FIG. 10 is the structural layout of the third conductive layer in FIG. 4; FIG. 11 is the structural layout of the fourth conductive layer in FIG. 4; FIG. 12 is the structural layout of the fifth conductive layer in FIG. 4; FIG. 13 is structural layout of the electrode layer in FIG. 4; FIG. 14 is the structural layout of the shielding layer and the first active layer in FIG. 4; FIG. 15 is the structural layout of the shielding layer, the first active layer, and the first conductive layer in FIG. 4; FIG. 16 is the structural layout of the shielding layer, the first active layer, the first conductive layer, and the second conductive layer in FIG. 4; FIG. 17 is the structural layout of the shielding layer, the first active layer, the first conductive layer, and the second conductive layer and the second active layer in FIG. 4; FIG. 18 is the structural layout of the shielding layer, the first active layer, the first conductive layer, the second conductive layer, the second active layer, and the third conductive layer in FIG. 4; FIG. 19 is the structural layout of the shielding layer, the first active layer, the first conductive layer, the second conductive layer, the second active layer, the third conductive layer, and the fourth conductive layer in FIG. 4; FIG. 20 is the structural layout of the shielding layer, the first active layer, the first conductive layer, the second conductive layer, the second active layer, the third conductive layer, the fourth conductive layer, and the fifth conductive layer. The display panel may include more than one pixel driving circuit shown in FIG. 2. As shown in FIG. 20, more than one pixel driving circuit may include a first pixel driving circuit Pix1 and a second pixel driving circuit Pix2 adjacently distributed in the first direction X; the first pixel driving circuit Pix1 and the second pixel driving circuit Pix2 may be provided mirror-symmetrically. Among them, the first pixel driving circuit Pix1 and the second pixel driving circuit Pix2 may form a repeating unit, and the display panel may include more than one repeating unit distributed in an array in the first direction X and the second direction Y. Among them, the first direction X may intersect with the second direction Y; for example, the first direction may be a row direction, and the second direction may be a column direction.

Figure 4:
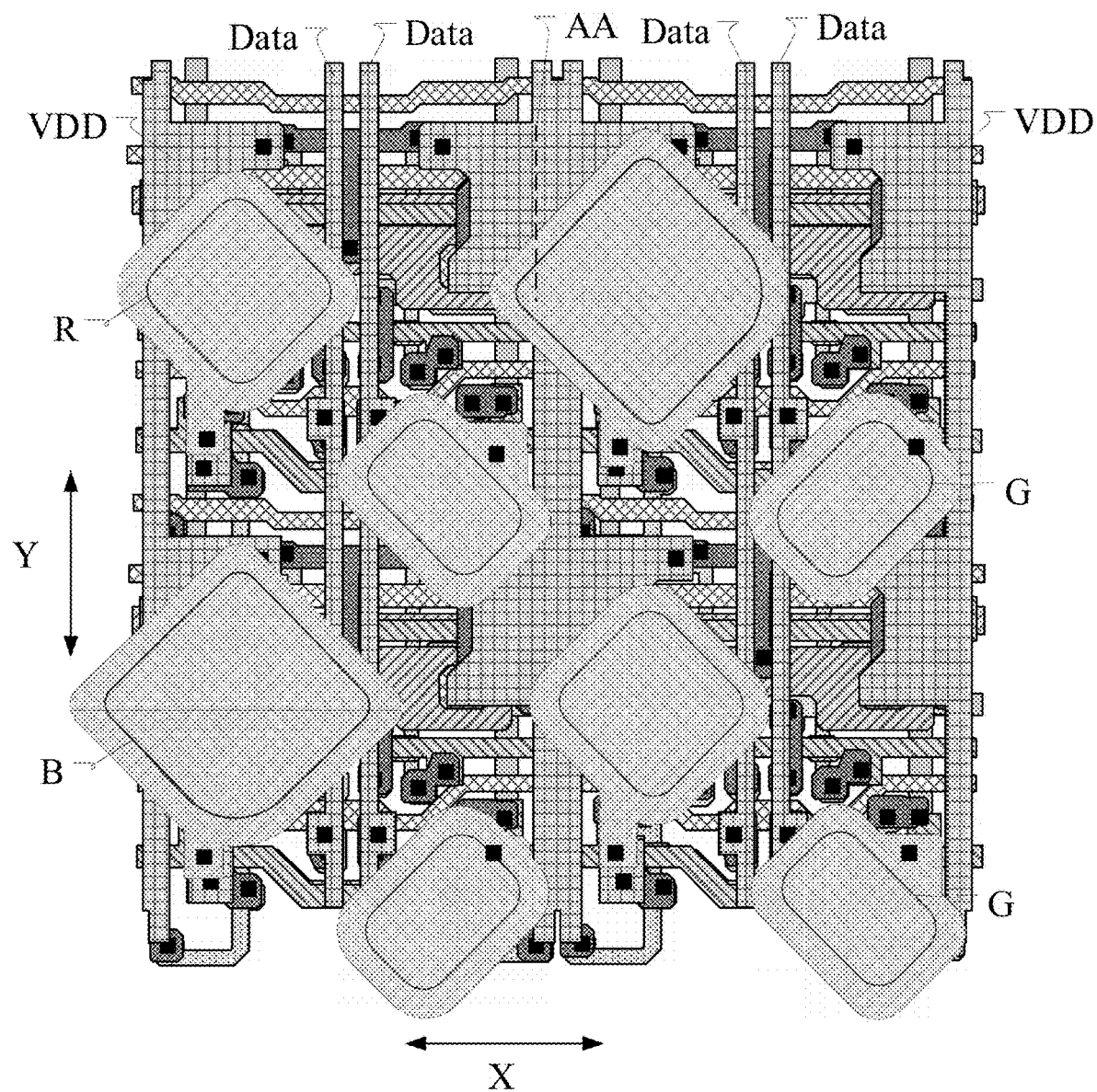
FIG. 4 is a structural layout of a display panel according to some embodiments of the present disclosure.
Figure 5:
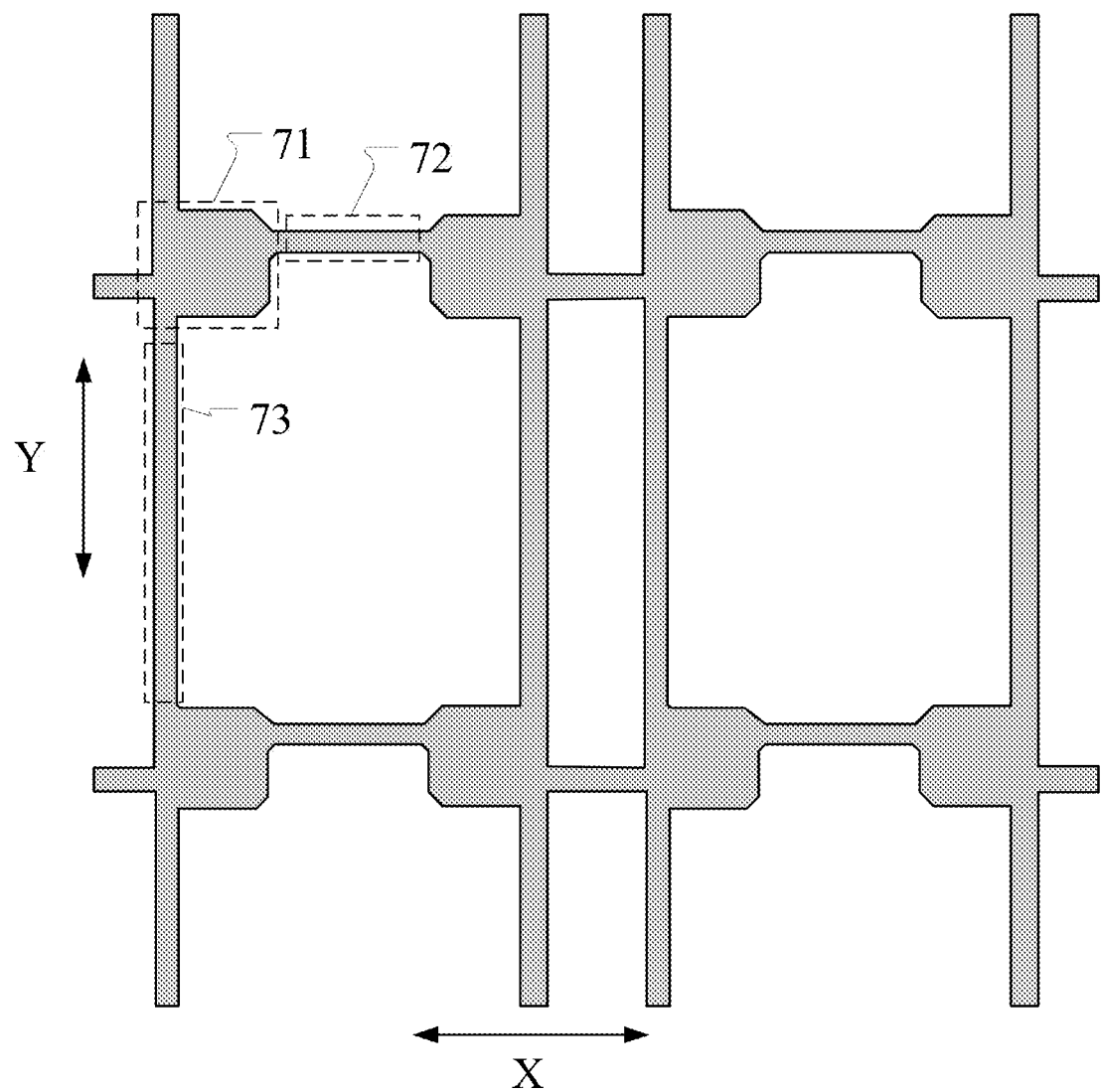
FIG. 5 is a structural layout of the shielding layer in FIG. 4.

As shown in FIG. 4, FIG. 5, and FIG. 14, the shielding layer may include more than one shielding portion 71, a connection portion 73, and a connection portion 72; the orthographic projection of the connection portion 73 on the base substrate extends along the second direction Y, and is connected between the shielding portions 71 adjacent in the second direction Y; the orthographic projection of the connection portion 72 on the base substrate extends along the first direction X, and is connected between the shielding portions 71 adjacent in the first direction X.

As shown in FIG. 4, FIG. 6, FIG. 14 and FIG. 15, the first active layer may include a first active portion 61, a third active portion 63, a fourth active portion 64, a fifth active portion 65, a sixth active portion 66, a seventh active portion 67, an eighth active portion 68, a ninth active portion 69, a tenth active portion 610, an eleventh active portion 611, a twelfth active portion 612, a thirteenth active portion 613, a fourteenth active portion 614, a fifteenth active portion 615, and a sixteenth active portion 616. Among them, the first active portion 61 is configured to form the channel region of the first transistor; the third active portion 63 may be configured to form the channel region of the driving transistor T3; the fourth active portion 64 may be configured to form the channel region of the fourth transistor T4; the fifth active portion 65 may be configured to form the channel region of the fifth transistor T5; the sixth active portion 66 may be configured to form the channel region of the sixth transistor T6; the seventh active portion 67 may be configured to form the channel region of the seventh transistor T7; the eighth active portion 68 is connected to an end of the fifth active portion 65 away from the third active portion 63; the ninth active portion 69 is connected between the seventh active portion 67 and the fifth active portion 65; the tenth active portion 610 is connected to an end of the third active portion 63 away from the fifth active portion 65; the eleventh active portion 611 is connected to an end of the seventh active portion 67 away from the third active portion 63; the twelfth active portion 612 and the thirteenth active portion 613 are connected to two ends of the fourth active portion 64 end; the fourteenth active portion 614 is connected to an end of the sixth active portion 66 away from the first active portion 61; the fifteenth active portion 615 is connected to an end of the first active portion 61 away from the sixth active portion 66; the sixteenth active portion 616 is connected between the first active portion 61 and the sixth active portion 66. As shown in FIG. 14, the orthographic projection of the shielding portion 71 on the base substrate may cover the orthographic projection of the third active portion 63 on the base substrate, and the shielding portion 71 may reduce the effect of light on the characteristics of the driving transistor. The first active layer may be formed of polysilicon material, and correspondingly, the first transistor T1, the driving transistor T3, the fourth transistor T4, the fifth transistor T5, the sixth transistor T6, and the seventh transistor T7 may be P-type low-temperature polysilicon thin film transistors.

As shown in FIG. 4, FIG. 7, and FIG. 15, the first conductive layer may include: a first conductive portion 11, a second gate line G2, a first enabling signal line EM1, a second enabling signal line EM2, a second reset signal line Re2, and a first reset signal line Re1. Orthographic projections of the second gate line G2, the first enabling signal line EM1, the second enabling signal line EM2, the second reset signal line Re2, and the first reset signal line Re1 on the base substrate may all extend along the first direction X. The second gate line G2 may be configured to provide the second gate driving signal end in FIG. 2; the first enabling signal line EM1 may be configured to provide the first enabling signal end in FIG. 2; the second enabling signal line EM2 may be configured to provide the second enabling signal end in FIG. 2; the second reset signal line Re2 may be configured to provide the second reset signal end in FIG. 2; and, the first reset signal line Re1 may be configured to provide the first reset signal end in FIG. 2. Among them, the orthographic projection of the second gate line G2 on the base substrate covers the orthographic projection of the fourth active portion 64 on the base substrate, and partial structure of the second gate line G2 is configured to form the gate of the fourth transistor. The orthographic projection of the first enabling signal line EM1 on the base substrate covers the orthographic projection of the sixth active portion 66 on the base substrate, and partial structure of the first enabling signal line EM1 is configured to form the gate of the sixth transistor. The orthographic projection of the second enabling signal line EM2 on the base substrate covers the orthographic projection of the fifth active portion 65 on the base substrate, and partial structure of the second enabling signal line EM2 is configured to form the gate of the fifth transistor. The orthographic projection of the second reset signal line Re2 on the base substrate may cover the orthographic projection of the seventh active portion 67 on the base substrate, and partial structure of the second reset signal line Re2 may be configured to form the gate of the seventh transistor T7. The orthographic projection of the first reset signal line Re1 on the base substrate may cover the orthographic projection of the first active portion 61 on the base substrate, and partial structure of the first reset signal line Re1 is configured to form the gate of the first transistor T1. The orthographic projection of the first conductive portion 11 on the base substrate covers the orthographic projection of the third active portion 63 on the base substrate, and the first conductive portion 11 may be configured to form the gate of the driving transistor T3 and the first electrode of the capacitor C. The shielding layer may be connected to a stable power supply end; for example, the shielding layer may be connected to a stable power supply end; for example, the shielding layer may be connected to the first power supply end, the first initial signal end, the second initial signal end in FIG. 1, etc. The shielding portion 71 may stabilize the voltage of the first conductive portion 11, thus reducing the voltage fluctuation of the gate of the driving transistor T3 in the light-emitting phase. In addition, the display panel may use the first conductive layer as a mask to perform a conducting treatment on the first active layer; that is, the region in the first active layer covered by the first conductive layer may form the channel region of the transistor, and the region not covered by the first conductive layer may form a conductor structure.

As shown in FIG. 4, FIG. 8, and FIG. 16, the second conductive layer may include: a third gate line 2G1 and more than one second conductive portion 22. Among them, the third gate line 2G1 may be configured to provide the first gate driving signal end in FIG. 2, and the orthographic projection of the third gate line 2G1 on the base substrate may extend along the first direction X. The orthographic projection of the second conductive portion 22 on the base substrate may at least partially overlap with the orthographic projection of the first conductive portion 11 on the base substrate, and the second conductive portion 22 may be configured to form the second electrode of the capacitor C. As shown in FIG. 8, the second conductive layer may further include more than one first connection portion 211, and the first connection portion 211 is connected between two second conductive portions 22 in a same repeating unit. As shown in FIG. 16, the orthographic projection of the first connection portion 211 on the base substrate may at least partially coincide with the orthographic projection of the connection portion 72 on the base substrate; such a configuration can reduce the shading effect of the first connection portion 211 on the display panel, thus improving the transmittance of the display panel. It should be understood that, in other example embodiments, in two adjacent repeating units in the first direction X, two adjacent second conductive portions 22 may also be connected to each other.

As shown in FIG. 4, FIG. 9, and FIG. 17, the second active layer may include more than one active portion, which may include a second active portion 82, a seventeenth active portion 817 and an eighteenth active portion 818 connected to two ends of the second active portion 82. The second active portion 82 may be configured to form a channel region of the second transistor T2. Among them, the second active layer may be formed of indium gallium zinc oxide, and correspondingly, the second transistor T2 may be an N-type metal oxide thin film transistor. The orthographic projection of the third gate line 2G1 on the base substrate may cover the orthographic projection of the second active portion 82 on the base substrate, and partial structure of the third gate line 2G1 may be configured to form the bottom gate of the second transistor.

As shown in FIG. 4, FIG. 10, and FIG. 18, the third conductive layer may include a first gate line 3G1, a second initial signal line Vinit2, and a first initial signal line Vinit1. The orthographic projection of the first initial signal line Vinit1 on the base substrate, the orthographic projection of the first gate line 3G1 on the base substrate, and the orthographic projection of the second initial signal line Vinit2 on the base substrate may all extend along the first direction X. The first gate line 3G1 may be configured to provide the first gate driving signal end in FIG. 2, and the orthographic projection of the first gate line 3G1 on the base substrate may cover the orthographic projection of the second active portion 82 on the base substrate. Partial structure of the first gate line 3G1 may be configured to form the top gate of the second transistor T2, and at the same time, the first gate line 3G1 may be connected to the third gate line 2G1 through a via hole located in a wiring region at the edge of the display panel. The first initial signal line Vinit1 is configured to provide the first initial signal end in FIG. 2, and the second initial signal line Vinit2 is configured to provide the second initial signal end in FIG. 2. In addition, the display panel may use the third conductive layer as a mask to perform a conducting treatment on the second active layer; that is, the region in the second active layer covered by the third conductive layer may form the channel region of the transistor, and the region not covered by the third conductive layer may form a conductor structure.

As shown in FIG. 4, FIG. 11 and FIG. 19, the fourth conductive layer may include a first bridging portion 41, a second bridging portion 42, a third bridging portion 43, a fourth bridging portion 44, a fifth bridging portion 45, a sixth bridging portion 46, a seventh bridging portion 47, and an eighth bridging portion 48. The first bridging portion 41 is provided correspondingly to the repeating unit; the first bridging portion 41 is connected to two eighth active portion 68 in the corresponding repeating unit through via holes (the black squares in the figure indicating the positions of the via holes) respectively, and the first bridging portion 41 is connected to the first connection portion 211 through a via hole, so as to connect the first pole of the fifth transistor T5 and the second electrode of the capacitor C. Among them, as shown in FIG. 11, the first bridging portion 41 includes: a first sub-bridging portion 411, a second sub-bridging portion 412, and a third sub-bridging portion 413; the orthographic projection of the first sub-bridging portion 411 on the base substrate extends along the second direction Y; the first end of the first sub-bridging portion 411 is connected to the first connection portion 211 through a via hole; the first end of the second sub-bridging portion 412 is connected to the second end of the first sub-bridging portion 411; the orthographic projection of the second sub-bridging portion 412 on the base substrate extends along the first direction X; the second end of the second sub-bridging portion 412 is connected to the eighth active portion 68 through a via hole; the first end of the third sub-bridging portion 413 is connected to the first end of the second sub-bridging portion 412; the orthographic projection of the third sub-bridging portion 413 on the base substrate extends along the first direction X, and the orthographic projection of the second end of the third sub-bridging portion 413 on the base substrate is located on a first side of the orthographic projection of the first end of the third sub-bridging portion 413 on the base substrate away from the orthographic projection of the second sub-bridging portion 412 on the base substrate; the second end of the third sub-bridging portion 413 is connected to the eighth active portion 68 through a via hole. The second bridging portion 42 can be connected to the first conductive portion 11 and the seventeenth active portion 817 through via holes respectively, so as to connect the first pole of the second transistor T2 and the gate of the driving transistor T3. As shown in FIG. 8, an opening 221 is formed on the second conductive portion 22, and the orthographic projection of the via hole connected between the first conductive portion 11 and the second bridging portion 42 on the base substrate is located within the orthographic projection of the opening 221 on the base substrate, so as to insulate the via hole connected between the first conductive portion 11 and the second bridging portion 42 from the second conductive portion 22. The third bridging portion 43 can be connected to the eighteenth active portion 818, the tenth active portion 610, and the fourteenth active portion 614 through via holes respectively, so as to connect the second pole of the second transistor T2, the second pole of the driving transistor T3 and the first pole of the sixth transistor. The fourth bridging portion 44 can be connected to the ninth active portion 69 and the twelfth active portion 612 through via holes respectively, so as to connect the second pole of the fourth transistor T4 and the first pole of the driving transistor T3. The fifth bridging portion 45 can be connected to the eleventh active portion 611 and the second initial signal line Vinit2 through via holes respectively, so as to connect the first pole of the seventh transistor and the second initial signal end. The sixth bridging portion 46 can be connected to the fifteenth active portion 615 and the first initial signal line Vinit1 through via holes respectively, so as to connect the first pole of the first transistor T1 and the first initial signal end. The seventh bridging portion 47 may be connected to the sixteenth active portion 616 through a via hole, so as to be connected to the second pole of the sixth transistor T6. The eighth bridging portion 48 may be connected to the thirteenth active portion 613 through a via hole, so as to be connected to the first pole of the fourth transistor T1.

As shown in FIG. 4, FIG. 12, and FIG. 20, the fifth conductive layer may include a power supply line VDD, a data line Data, and a ninth bridging portion 59. The ninth bridging portion 59 may be connected to the seventh bridging portion 47 through a via hole, so as to be connected to the second pole of the sixth transistor. The orthographic projection of the power supply line VDD on the base substrate may extend along the second direction Y, and the power supply line VDD is configured to provide the first power supply end in FIG. 2. The power supply line VDD may be connected to the first bridging portion 41 through a via hole, so as to connect the first power supply end and the first pole of the fifth transistor as well as the second electrode of the capacitor, where the power supply line VDD may be connected to the second end of the second sub-bridging portion 412 and the second end of the third sub-bridging portion 413 through via holes respectively. As shown in FIG. 12, the power supply line VDD may include a first extension portion VDD1, a second extension portion VDD2, and a third extension portion VDD3; the second extension portion VDD2 is connected between the first extension portion VDD1 and the third extension portion VDD3; the size of the orthographic projection of the second extension portion VDD2 on the base substrate in the first direction X may be larger than the size of the orthographic projection of the first extension portion VDD1 on the base substrate in the first direction X; and, the size of the orthographic projection of the second extension portion VDD2 on the base substrate in the first direction X may be larger than the size of the orthographic projection of the third extension portion VDD3 on the base substrate in the first direction X. The orthographic projection of the second extension portion VDD2 on the base substrate may cover the orthographic projection of the second active portion 82 on the base substrate, and the second extension portion VDD2 may reduce the effect of light on the characteristics of the second transistor. The orthographic projection of the second extension portion VDD2 on the base substrate may at least partially overlap with the orthographic projection of the second bridging portion 42 on the base substrate, and the second extension portion VDD2 may stabilize the voltage of the second bridging portion 42 and shield the second bridging portion 42 to reduce the voltage fluctuation of the gate of the driving transistor T3 in the light-emitting phase. For example, the orthographic projection of the second extension portion VDD2 on the base substrate may cover the orthographic projection of the second bridging portion 42 on the base substrate. In two adjacent repeating units in the first direction X, the second extension portions VDD2 in two adjacent power supply lines VDD may be connected to each other, so that the power supply line VDD and the second conductive portion 22 may form a grid structure, the power supply line of which may reduce the voltage drop of the power supply signal on it. The data line Data may be connected to the eighth bridging portion through a via hole, so as to connect the first pole of the fourth transistor and the data signal end.

As shown in FIG. 4 and FIG. 13, the electrode layer includes more than one electrode portion: a first electrode portion G, a second electrode portion B, and a third electrode portion R; each electrode portion can be connected to the ninth bridging portion 59 through a via hole, so as to be connected to the second pole of the sixth transistor. The display panel may further include a pixel definition layer located on the side of the electrode layer away from the base substrate; more than one pixel opening is formed on the pixel definition layer, the pixel opening is provided corresponding to the electrode portion, and the orthographic projection of the pixel opening on the base substrate coincides with the orthographic projection of the electrode portion on the base substrate. The first electrode portion G can be configured to form the electrode portion of the green light-emitting unit in the display panel, the second electrode portion B can be configured to form the electrode portion of the blue light-emitting unit in the display panel, and the third electrode portion R can be configured to form the electrode portion of the red light-emitting unit. Among more than one electrode portion connected to a same row of pixel driving circuits, the second electrode portion B, the first electrode portion G, the third electrode portion R, and the first electrode portion G are distributed alternately in sequence in the row direction X. In two adjacent columns of pixel driving circuits, more than one second electrode portion B and more than one third electrode portion R are connected to the same column of pixel driving circuits, and the second electrode portion B and the third electrode portion R connected to the same column of pixel driving circuits are distributed alternately in sequence in the column direction Y; more than one first electrode portion G is connected to another column of pixel driving circuits, and the first electrode portions G connected to the same column of pixel driving circuits are distributed at intervals in the column direction. The minimum distance S1 between the orthographic projections of two first electrode portions G connected to adjacent pixel driving circuit rows and connected to the same pixel driving circuit column on the base substrate in the column direction is greater than the size S2 of the orthographic projection of the third electrode portion R on the base substrate in the column direction, and/or, the minimum distance S1 between the orthographic projections of two first electrode portions G connected to adjacent pixel driving circuit rows and connected to the same pixel driving circuit column on the base substrate in the column direction is greater than the size S3 of the orthographic projection of the second electrode portion B on the base substrate in the column direction.

In some embodiments, as shown in FIG. 4-FIG. 20, the orthographic projection of the first reset signal line Re1 on the base substrate is located on a side of the orthographic projection of the second reset signal line Re2 on the base substrate away from the orthographic projection of the first conductive portion 11 on the base substrate. The orthographic projection of the second gate line G2 on the base substrate is located between the orthographic projection of the first reset signal line Re1 on the base substrate and the orthographic projection of the second reset signal line Re2 on the base substrate. The orthographic projection of the first enabling signal line EM1 on the base substrate is located on a side of the orthographic projection of the first reset signal line Re1 on the base substrate away from the orthographic projection of the first conductive portion 11 on the base substrate. In the first direction X, the orthographic projection of the seventh active portion 67 on the base substrate is located between the orthographic projection of the first active portion 61 on the base substrate and the orthographic projection of the fourth active portion 64 on the base substrate. The orthographic projection of the second enabling signal line EM2 on the base substrate is located on a side of the orthographic projection of the first conductive portion 11 on the base substrate away from the orthographic projection of the second reset signal line Re2 on the base substrate. The orthographic projection of the first gate line 3G1 on the base substrate is located between the orthographic projection of the first conductive portion 11 on the base substrate and the orthographic projection of the second enabling signal line EM2 on the base substrate. In the first direction, the orthographic projection of the third active portion 63 on the base substrate is located between the orthographic projection of the second active portion 82 on the base substrate and the orthographic projection of the seventh active portion 67 on the base substrate. The orthographic projection of the first initial signal line Vinit1 on the base substrate at least partially overlaps with the orthographic projection of the first reset signal line Re1 on the base substrate; the orthographic projection of the second initial signal line Vinit2 on the base substrate at least partially overlaps with the orthographic projection of the second reset signal line Re2 on the base substrate. The display panel has a high degree of integration.

It should be noted that, as shown in FIG. 4, FIG. 19, and FIG. 20, the black squares drawn on the side of the fourth conductive layer away from the base substrate indicate the via holes for the fourth conductive layer to be connected to other layers facing the side of base substrate. The black squares drawn on the side of the fifth conductive layer away from the base substrate indicate the via holes for the fifth conductive layer to be connected to other layers facing the side of the base substrate. The black squares drawn on the side of the electrode layer away from the base substrate indicates the via holes for the electrode layer to be connected to other layers facing the side of the base substrate. The black square indicates the position of the via hole, and different via holes represented by black squares at different positions may penetrate through different insulating layers.

Figure 21:
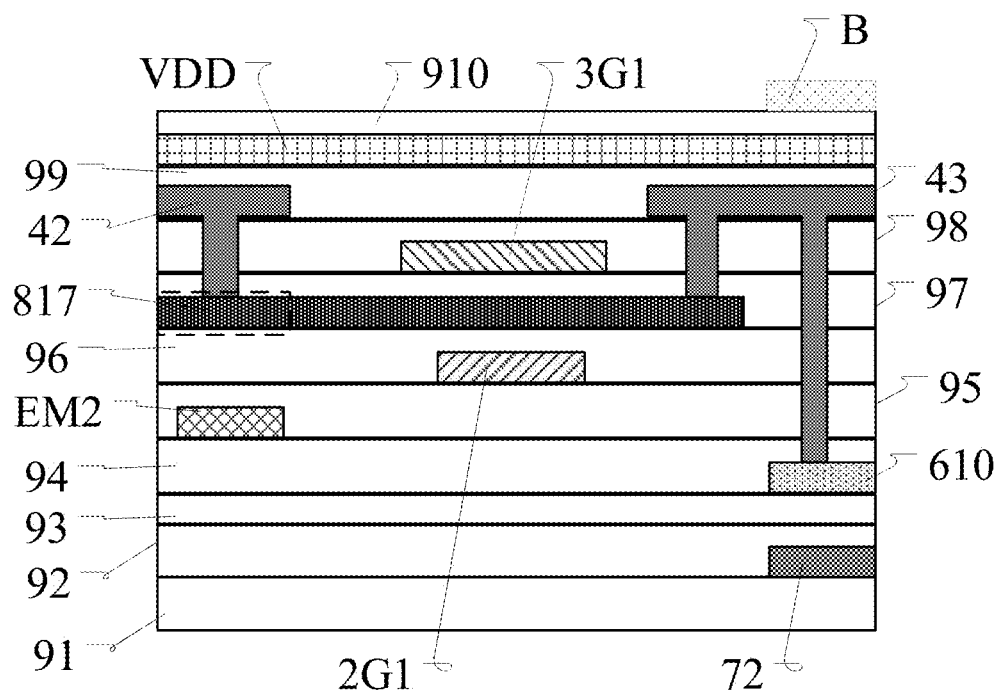
FIG. 21 is a partial cross-sectional view of the display panel shown in FIG. 4 cut along the dotted line AA.

As shown in FIG. 21, it is a partial cross-sectional view of the display panel shown in FIG. 4 cut along the dotted line AA. The display panel may further include a barrier layer 92, a first buffer layer 93, a first insulating layer 94, a second insulating layer 95, a second buffer layer 96, a third insulating layer 97, a first dielectric layer 98, a first flat layer 99, and a second flat layer 910. Among them, the base substrate 91, the shielding layer, the barrier layer 92, the first buffer layer 93, the first active layer, the first insulating layer 94, the first conductive layer, the second insulating layer 95, the second conductive layer, ild, the second buffer layer 96, the second active layer, the third insulating layer 97, the third conductive layer, the first dielectric layer 98, the fourth conductive layer, the first flat layer 99, the fifth conductive layer, the second flat layer 910 and the electrode layer are sequentially provided in stack. The barrier layer 92 may include a silicon oxide layer; the first buffer layer 93 and the second buffer layer 96 may include one or more of silicon oxide layer and silicon nitride layer; the first insulating layer 94, the second insulating layer 95, and the third insulating layer 97 may include one or more of silicon oxide layer and silicon nitride layer; the first dielectric layer 98 may include a silicon nitride layer; the materials of the first flat layer 99 and the second flat layer 910 can be organic materials, such as polyimide (PI), polyethylene terephthalate (PET), polyethylene naphthalate (PEN), silicon-glass bonding structure (SOG) and other materials. The base substrate 91 may include a glass substrate, a barrier layer, and a polyimide layer, which are sequentially provided in stack, and the barrier layer may be of an inorganic material. The materials of the first conductive layer, the second conductive layer, and the third conductive layer may be one of molybdenum, aluminum, copper, titanium, niobium or an alloy, or a molybdenum/titanium alloy or lamination. The materials of the fourth conductive layer and the fifth conductive layer may include metal materials, such as one of molybdenum, aluminum, copper, titanium, niobium or an alloy, or a molybdenum/titanium alloy or lamination, or a titanium/aluminum/titanium lamination, etc. The electrode layer may include an indium tin oxide layer, or a silver layer. The sheet resistance of any one of the first conductive layer, the second conductive layer and the third conductive layer may be greater than the sheet resistance of any one of the fourth conductive layer and the fifth conductive layer.

It should be noted that the scale of the drawings in the present disclosure can be used as a reference in the actual process, but is not limited to this; for example, the width-to-length ratio of the channel, the thickness of and the spacing between each film layer, the width of and the spacing between each signal line can be adjusted according to actual needs. The number of pixels in the display substrate and the number of sub-pixels in each pixel are not limited to the numbers shown in the drawings. The drawings described in the present disclosure are only structural schematic diagrams. In addition, the qualifiers such as "first", "second" and the like are only used to define different structural names, and they have no meaning of specific order and quantity. In some embodiments, the orthographic projection of a certain structure on the base substrate extending along a certain direction may be understood as the orthographic projection of the structure on the base substrate extends straightly or curvedly along the direction. A transistor refers to an element including at least three terminals of a gate, a drain, and a source. A transistor has a channel region between the drain (the drain electrode terminal, the drain region, or the drain electrode) and the source (the source electrode terminal, the source region, or the source electrode); and, a current can flow through the drain, the channel region, and the source. In some embodiments, the channel region refers to a region through which current mainly flows. In some embodiments, the first pole may be the drain, and the second pole may be the source; or, the first pole may be the source, and the second pole may be the drain. In the case of using a transistor with opposite polarities or when the current direction changes during circuit operation, the functions of "source" and "drain" are sometimes interchanged with each other. Therefore, in some embodiments, "source" and "drain" can be interchanged with each other. In addition, the gate may also be referred to as a control pole.

According to some embodiments of the present disclosure, there is further provided a display device, including the above-mentioned display panel. The display device may be a display device such as a mobile phone, a tablet computer, or a television, etc.

Other embodiments of the present disclosure will be readily apparent to those skilled in the art from consideration of the description and practice of the present disclosure here.

The present disclosure is intended to cover any modification, use or adaptation of the present disclosure, which follow the general principles of the present disclosure and include common knowledge or conventional technique means in the technical field not disclosed in the present disclosure. The description and embodiments are to be considered exemplary only, with the true scope and spirit of the present disclosure indicated by the appended claims.

The drawings in the present disclosure only relate to the structures involved in the present disclosure, and other structures may refer to general designs. In the case of no conflict, the embodiments of the present disclosure and the features in the embodiments can be combined with each other to obtain new embodiments. Those skilled in the art should understand that the technical solutions of the present disclosure can be modified or equivalently replaced, without departing from the spirit and scope of the technical solutions of the present disclosure, and they should be covered by the scope of the claims of the present disclosure.

It should be understood that the present disclosure is not limited to the precise constructions which have been described above and shown in the drawings, and various modifications and changes may be made without departing from the scope of the present disclosure. The scope of the present disclosure is limited only by the appended claims.

What is claimed is:

1. A driving method for a pixel driving circuit, wherein the driving method is used for driving the pixel driving circuit, and the pixel driving circuit comprises:
    a driving circuit, connected to a first node, a second node and a third node, and configured to input a driving current to the third node through the second node according to a signal of the first node;
    a compensation circuit, connected to the first node, the third node and a first gate driving signal end, and configured to turn on the first node and the third node in response to a signal of the first gate driving signal end;
    a first light-emitting control circuit, connected to the third node, a fourth node and a first enabling signal end, and configured to communicate with the third node and the fourth node in response to a signal of the first enabling signal end;
    a first reset circuit, connected to the fourth node, a first initial signal end and a first reset signal end, and configured to transmit a signal of the first initial signal end to the fourth node in response to a signal of the first reset signal end; and
    a second reset circuit, connected to the second node, a second initial signal end and a second reset signal end, and configured to transmit a signal of the second initial signal end to the second node in response to a signal of the second reset signal end;
    and wherein, the driving method comprises:
    in a first reset phase, inputting an active level to the first reset signal end and the second reset signal end; and
    in a hysteresis elimination phase, inputting an active level to the first reset signal end, the first enabling signal end and the first gate driving signal end.

2. The driving method according to claim 1, wherein the pixel driving circuit further comprises:
    a data writing circuit, connected to the second node, a data signal end and a second gate driving signal end, and configured to transmit a signal of the data signal end to the second node in response to a signal of the second gate driving signal end;

a second light-emitting control circuit, connected to a first power supply end, the second node and a second enabling signal end, and configured to transmit a signal of the first power supply end to the second node in response to a signal of the second enabling signal end; and a storage circuit, connected between the first node and the first power supply end.

3. The driving method according to claim 1, wherein the driving circuit comprises:

a driving transistor, a first pole of the driving transistor being connected to the second node, a second pole of the driving transistor being connected to the third node, and a gate of the driving transistor being connected to the first node;

the compensation circuit comprises:

a second transistor, a first pole of the second transistor being connected to the first node, a second pole of the second transistor being connected to the third node, and a gate of the second transistor being connected to the first gate driving signal end;

the first light-emitting control circuit comprises:

a sixth transistor, a first pole of the sixth transistor being connected to the third node, a second pole of the sixth transistor being connected to the fourth node, and a gate of the sixth transistor being connected to the first enabling signal end;

the first reset circuit comprises:

a first transistor, a first pole of the first transistor the being connected to the first initial signal end, a second pole of the first transistor being connected to the fourth node, and a gate of the first transistor being connected to the first reset signal end; and the second reset circuit comprises:

a seventh transistor, a first pole of the seventh transistor being connected to the second initial signal end, a second pole of the seventh transistor being connected to the second node, and a gate of the seventh transistor being connected to the second reset signal end;

wherein the second transistor is an N-type transistor, and the driving transistor is a P-type transistor.

4. The driving method according to claim 2, wherein the data writing circuit comprises:

a fourth transistor, a first pole of the fourth transistor being connected to the data signal end, a second pole of the fourth transistor being connected to the second node, and a gate of the fourth transistor being connected to the second gate driving signal end;

the second light-emitting control circuit comprises:

a fifth transistor, a first pole of the fifth transistor being connected to the first power supply end, a second pole of the fifth transistor being connected to the second node, and a gate of the fifth transistor being connected to the second enabling signal end; and the storage circuit comprises:

a capacitor, a first electrode of the capacitor being connected to the first node, and a second electrode of the capacitor being connected to the first power supply end.

5. A display panel, comprising a pixel driving circuit and a light-emitting unit, the pixel driving circuit being configured to provide a driving current to the light-emitting unit, and the pixel driving circuit comprising:

a driving transistor;

a second transistor, a first pole of the second transistor being connected to a gate of the driving transistor, and a second pole of the second transistor being connected to a second pole of the driving transistor;

a sixth transistor, a first pole of the sixth transistor being connected to the second pole of the driving transistor, and a second pole of the sixth transistor being connected to a first electrode of the light-emitting unit;

a first transistor, a first pole of the first transistor being connected to a first initial signal line, and a second pole of the first transistor being connected to the first electrode of the light-emitting unit; and a seventh transistor, a first pole of the seventh transistor being connected to a second initial signal line, and a second pole of the seventh transistor being connected to a first pole of the driving transistor;

and wherein, the display panel further comprises:

a base substrate;

a first active layer, located on a side of the base substrate, the first active layer comprising a first active portion, a third active portion, a sixth active portion and a seventh active portion, the first active portion being configured to form a channel region of the first transistor, the third active portion being configured to form a channel region of the driving transistor, the sixth active portion being configured to form a channel region of the sixth transistor, and the seventh active portion being configured to form a channel region of the seventh transistor;

a first conductive layer, located on a side of the first active layer away from the base substrate, the first conductive layer comprising a first reset signal line, a second reset signal line, a first enabling signal line and a first conductive portion, orthographic projections of the first reset signal line, the second reset signal line and the first enabling signal line on the base substrate extending along a first direction, partial structure of the first reset signal line being configured to form a gate of the first transistor, partial structure of the second reset signal line being configured to form a gate of the seventh transistor, partial structure of the first enabling signal line being configured to form a gate of the sixth transistor, and the first conductive portion being configured to form the gate of the driving transistor;

a second active layer, located on a side of the first conductive layer away from the base substrate, the second active layer comprising a second active portion, and the second active portion being configured to form a channel region of the second transistor; and a third conductive layer, located on a side of the second active layer away from the base substrate, the third conductive layer comprising a first gate line, an orthographic projection of the first gate line on the base substrate extending along the first direction, and partial structure of the first gate line being configured to form a top gate of the second transistor;

wherein an orthographic projection of the first reset signal line on the base substrate is located on a side of an orthographic projection of the second reset signal line on the base substrate away from an orthographic projection of the first conductive portion on the base substrate.

6. The display panel according to claim 5, wherein the pixel driving circuit further comprises a fourth transistor, a first pole of the fourth transistor is connected to a data line, and a second pole of the fourth transistor is connected to the first pole of the driving transistor;

the first active layer further comprises a fourth active portion configured to form a channel region of the fourth transistor;

the first conductive layer further comprises a second gate line, an orthographic projection of the second gate line on the base substrate extends along the first direction and covers an orthographic projection of the fourth active portion on the base substrate, and partial structure of the second gate line is configured to form a gate of the fourth transistor;

wherein, the orthographic projection of the second gate line on the base substrate is located between the orthographic projection of the first reset signal line on the base substrate and the orthographic projection of the second reset signal line on the base substrate; and in the first direction, an orthographic projection of the seventh active portion on the base substrate is located between an orthographic projection of the first active portion on the base substrate and an orthographic projection of the fourth active portion on the base substrate.

7. The display panel according to claim 5, wherein the first active portion and the sixth active portion are connected through partial structure of the first active layer; and an orthographic projection of the first enabling signal line on the base substrate is located on a side of an orthographic projection of the first reset signal line on the base substrate away from an orthographic projection of the first conductive portion on the base substrate.

8. The display panel according to claim 5, wherein the pixel driving circuit further comprises a fifth transistor, a first pole of the fifth transistor is connected to a power supply line, and a second pole of the fifth transistor is connected to the first pole of the driving transistor;

the first active layer further comprises a fifth active portion configured to form a channel region of the fifth transistor, and the fifth active portion is connected to the third active portion and the seventh active portion through partial structure of the first active layer;

the first conductive layer further comprises a second enabling signal line, an orthographic projection of the second enabling signal line on the base substrate extends along the first direction and covers an orthographic projection of the fifth active portion on the base substrate, and partial structure of the second enabling signal line is configured to form a gate of the fifth transistor;

wherein, the orthographic projection of the second enabling signal line on the base substrate is located on a side of an orthographic projection of the first conductive portion on the base substrate away from an orthographic projection of the second reset signal line on the base substrate; and an orthographic projection of the first gate line on the base substrate is located between the orthographic projection of the first conductive portion on the base substrate and the orthographic projection of the second enabling signal lines on the base substrate.

9. The display panel according to claim 5, wherein, in the first direction, an orthographic projection of the third active portion on the base substrate is located between an orthographic projection of the second active portion on the base substrate and an orthographic projection of the seventh active portion on the base substrate.

10. The display panel according to claim 5, wherein the display panel comprises more than one repeating unit, the more than one repeating unit is distributed in an array in the first direction and a second direction, and the first direction intersects with the second direction;

a repeating unit comprises two pixel driving circuits distributed in the first direction, and the two pixel driving circuits in a same repeating unit are provided mirror-symmetrically.

11. The display panel according to claim 10, wherein the pixel driving circuit further comprises a capacitor, a first electrode of the capacitor is connected to the gate of the driving transistor, a second electrode of the capacitor is connected to a power supply line, and the first conductive portion is multiplexed as the first electrode of the capacitor;

the display panel further comprises:

a second conductive layer, located between the first conductive layer and the second active layer, the second conductive layer comprising a second conductive portion and a first connection portion, an orthographic projection of the second conductive portion on the base substrate at least partially overlapping with an orthographic projection of the first conductive portion on the base substrate, and the second conductive portion being configured to form the second electrode of the capacitor;

the first direction is a row direction, the second direction is a column direction, each column of the pixel driving circuit is correspondingly provided with a power supply line, and an orthographic projection of the power supply line on the base substrate extends along the column direction;

the power supply line comprises a first extension portion, a second extension portion, and a third extension portion, and the second extension portion is connected between the first extension portion and the third extension portion;

a size of an orthographic projection of the second extension portion on the base substrate in the row direction is greater than a size of an orthographic projection of the first extension portion on the base substrate in the row direction, and the size of the orthographic projection of the second extension portion on the base substrate in the row direction is greater than a size of an orthographic projection of the third extension portion on the base substrate in the row direction;

wherein, the first connection portion is connected between two second conductive portions in the same repeating unit; and, in two repeating units adjacent in the first direction, second extension portions in two adjacent power supply lines are connected to each other.

12. The display panel according to claim 11, wherein the pixel driving circuit further comprises a fifth transistor, a first pole of the fifth transistor is connected to the power supply line, and a second pole of the fifth transistor is connected to the first pole of the driving transistor;

the first active layer further comprises a fifth active portion and an eighth active portion, the fifth active portion is configured to form a channel region of the fifth transistor, and the eighth active portion is connected to an end of the fifth active portion away from the seventh active portion;

the display panel further comprises:

a fourth conductive layer, located on a side of the third conductive layer away from the base substrate, the fourth conductive layer comprising a first bridging portion, and the first bridging portion and the repeating unit being provided correspondingly;

wherein, the first bridging portion is connected to two eighth active portions in a repeating unit corresponding to the first bridging portion through via holes respectively, the first bridging portion is connected to two power supply lines in the repeating unit corresponding to the first bridging portion through via holes respectively, and the first bridging portion is connected to the first connection portion through a via hole.

13. The display panel according to claim 12, wherein the first bridging portion comprises:
   a first sub-bridging portion, an orthographic projection of the first sub-bridging portion on the base substrate extending along the second direction, and a first end of the first sub-bridging portion being connected to the first connection portion through a via hole;
   a second sub-bridging portion, a first end of the second sub-bridging portion being connected to a second end of the first sub-bridging portion, an orthographic projection of the second sub-bridging portion on the base substrate extending along the first direction, and a second end of the second sub-bridging portion being connected to the eighth active portion and the power supply line through via holes respectively; and
   a third sub-bridging portion, a first end of the third sub-bridging portion being connected to the first end of the second sub-bridging portion, an orthographic projection of the third sub-bridging portion on the base substrate extending along the first direction, an orthographic projection of a second end of the third sub-bridging portion on the base substrate being located on a side of an orthographic projection of the first end of the third sub-bridging portion on the base substrate away from the orthographic projection of the second sub-bridging portion on the base substrate, and the second end of the third sub-bridging portion being connected to the eighth active portion and the power supply line through via holes respectively.

14. The display panel according to claim 5, wherein the third conductive layer further comprises:
   a first initial signal line, an orthographic projection of the first initial signal line on the base substrate extending along the first direction, the orthographic projection of the first initial signal line on the base substrate at least partially overlapping with an orthographic projection of the first reset signal line on the base substrate; and
   a second initial signal line, an orthographic projection of the second initial signal line on the base substrate extending along the first direction, the orthographic projection of the second initial signal line on the base substrate at least partially overlapping with an orthographic projection of the second reset signal line on the base substrate.

15. The display panel according to claim 5, wherein the pixel driving circuit further comprises:
   a fourth transistor, a first pole of the fourth transistor being connected to a data line, and a second pole of the fourth transistor being connected to the first pole of the driving transistor;
   a fifth transistor, a first pole of the fifth transistor being connected to a power supply line, and the second pole of the fifth transistor being connected to the first pole of the driving transistor; and
   a capacitor, a first electrode of the capacitor being connected to the gate of the driving transistor, and a second electrode of the capacitor being connected to the power supply line;
   wherein, the first transistor, the driving transistor, the fourth transistor, the fifth transistor, the sixth transistor, and the seventh transistor are P-type transistors, and the second transistor is an N-type transistor.

16. The display panel according to claim 6, wherein the first active layer further comprises a ninth active portion, a twelfth active portion and a thirteenth active portion; the ninth active portion part is connected between the fifth active portion and the seventh active portion; the fourth active portion is connected between the twelfth active portion and the thirteenth active portion;
   the display panel further comprises a fourth conductive layer, and the fourth conductive layer is located on a side of the third conductive layer away from the base substrate; the fourth conductive layer comprises a fourth bridging portion and an eighth bridging portion; the fourth bridging portion is connected to the twelfth active portion and the ninth active portion through via holes respectively, and the eighth bridging portion is connected to the thirteenth active portion through a via hole.

17. A display device, comprising a display panel, wherein the display panel comprises a pixel driving circuit and a light-emitting unit, the pixel driving circuit is configured to provide a driving current to the light-emitting unit, and the pixel driving circuit comprises:
   a driving transistor;
   a second transistor, a first pole of the second transistor being connected to a gate of the driving transistor, and a second pole of the second transistor being connected to a second pole of the driving transistor;
   a sixth transistor, a first pole of the sixth transistor being connected to the second pole of the driving transistor, and a second pole of the sixth transistor being connected to a first electrode of the light-emitting unit;
   a first transistor, a first pole of the first transistor being connected to a first initial signal line, and a second pole of the first transistor being connected to the first electrode of the light-emitting unit; and
   a seventh transistor, a first pole of the seventh transistor being connected to a second initial signal line, and a second pole of the seventh transistor being connected to a first pole of the driving transistor;
   and wherein, the display panel further comprises:
   a base substrate;
   a first active layer, located on a side of the base substrate, the first active layer comprising a first active portion, a third active portion, a sixth active portion and a seventh active portion, the first active portion being configured to form a channel region of the first transistor, the third active portion being configured to form a channel region of the driving transistor, the sixth active portion being configured to form a channel region of the sixth transistor, and the seventh active portion being configured to form a channel region of the seventh transistor;
   a first conductive layer, located on a side of the first active layer away from the base substrate, the first conductive layer comprising a first reset signal line, a second reset signal line, a first enabling signal line and a first conductive portion, orthographic projections of the first reset signal line, the second reset signal line and the first enabling signal line on the base substrate extending along a first direction, partial structure of the first reset signal line being configured to form a gate of the first transistor, partial structure of the second reset signal line being configured to form a gate of the seventh transistor, partial structure of the first enabling signal line being configured to form a gate of the sixth transistor, and the first conductive portion being configured to form the gate of the driving transistor;

a second active layer, located on a side of the first conductive layer away from the base substrate, the second active layer comprising a second active portion, and the second active portion being configured to form a channel region of the second transistor; and a third conductive layer, located on a side of the second active layer away from the base substrate, the third conductive layer comprising a first gate line, an orthographic projection of the first gate line on the base substrate extending along the first direction, and partial structure of the first gate line being configured to form a top gate of the second transistor;

wherein an orthographic projection of the first reset signal line on the base substrate is located on a side of an orthographic projection of the second reset signal line on the base substrate away from an orthographic projection of the first conductive portion on the base substrate.

* * * * *

UNITED STATES PATENT AND TRADEMARK OFFICE
CERTIFICATE OF CORRECTION

| | | |
|---|---|---|
| PATENT NO. | : 12,424,165 B2 | Page 1 of 1 |
| APPLICATION NO. | : 18/563498 | |
| DATED | : September 23, 2025 | |
| INVENTOR(S) | : Yang et al. | |

It is certified that error appears in the above-identified patent and that said Letters Patent is hereby corrected as shown below:

On the Title Page

The second Applicant in item (71):
BOE TECHNOLOGY GROUP CO. LTD.
Should read:
---BOE TECHNOLOGY GROUP CO., LTD.---

Signed and Sealed this
Twenty-fifth Day of November, 2025

John A. Squires
*Director of the United States Patent and Trademark Office*